(12) United States Patent
Lay et al.

(10) Patent No.: US 8,397,213 B2
(45) Date of Patent: Mar. 12, 2013

(54) HARDWARE PROGRAMMING AND LAYOUT DESIGN

(75) Inventors: Ralf Lay, Mannheim (DE);
Klaus-Henning Noffz, Mannheim (DE)

(73) Assignee: Silicon Software GmbH, Mannhein (DE)

( * ) Notice: Subject to any disclaimer, the term of this patent is extended or adjusted under 35 U.S.C. 154(b) by 1214 days.

(21) Appl. No.: 12/067,268

(22) PCT Filed: Sep. 19, 2006

(86) PCT No.: PCT/EP2006/009081
§ 371 (c)(1),
(2), (4) Date: Mar. 18, 2008

(87) PCT Pub. No.: WO2007/033812
PCT Pub. Date: Mar. 29, 2007

(65) Prior Publication Data
US 2008/0256511 A1    Oct. 16, 2008

(30) Foreign Application Priority Data

Sep. 19, 2005  (DE) .......................... 10 2005 044 728

(51) Int. Cl.
*G06F 9/44*  (2006.01)
(52) U.S. Cl. ......... 717/107; 717/106; 717/155; 717/156
(58) Field of Classification Search ........................ None
See application file for complete search history.

(56) References Cited

U.S. PATENT DOCUMENTS

| | | | | |
|---|---|---|---|---|
| 4,716,523 A * | 12/1987 | Burrus et al. | ................... | 710/28 |
| 5,287,505 A * | 2/1994 | Calvert et al. | ......................... | 1/1 |
| 5,418,942 A * | 5/1995 | Krawchuk et al. | ..................... | 1/1 |
| 5,487,167 A * | 1/1996 | Dinallo et al. | ................ | 715/203 |
| 5,748,875 A * | 5/1998 | Tzori | ............................... | 714/29 |
| 5,784,649 A * | 7/1998 | Begur et al. | ..................... | 710/52 |
| 5,797,043 A * | 8/1998 | Lewis et al. | ..................... | 710/56 |
| 5,822,553 A * | 10/1998 | Gifford et al. | ................ | 710/305 |
| 5,933,642 A * | 8/1999 | Greenbaum et al. | .......... | 717/140 |
| 5,960,437 A * | 9/1999 | Krawchuk et al. | ............. | 707/702 |
| 7,177,786 B2 * | 2/2007 | Kodosky et al. | .................. | 703/2 |
| 7,210,145 B2 * | 4/2007 | Srinivasan | ..................... | 718/100 |
| 7,299,458 B2 * | 11/2007 | Hammes | ....................... | 717/133 |
| 7,509,647 B2 * | 3/2009 | Donaldson et al. | ........... | 718/106 |
| 7,613,902 B1 * | 11/2009 | Martin et al. | .................. | 712/201 |
| 8,065,130 B1 * | 11/2011 | Brebner et al. | .................. | 703/14 |
| 2002/0080174 A1 * | 6/2002 | Kodosky et al. | ................ | 345/762 |
| 2002/0178285 A1 * | 11/2002 | Donaldson et al. | ........... | 709/237 |
| 2003/0033588 A1 * | 2/2003 | Alexander | ..................... | 717/107 |
| 2004/0044794 A1 * | 3/2004 | Srinivasan | .................... | 709/248 |
| 2004/0088689 A1 * | 5/2004 | Hammes | ....................... | 717/154 |

FOREIGN PATENT DOCUMENTS

EP          0645723 A2    3/1995
WO      WO 9909498 A     2/1999

OTHER PUBLICATIONS

Title: Control flow prediction for dynamic ILP processors, author: Pnevmatikatos, D.N. et al, dated: 1993, source: IEEE.*

(Continued)

*Primary Examiner* — Chameli Das
(74) *Attorney, Agent, or Firm* — IPXLAW Group LLP; Claude A. S. Hamrick

(57) ABSTRACT

The invention relates to programming hardware for useful data processing also used in the form of a suitable graphical editor. The inventive method consists in providing a plurality of modules, wherein each module can carry out at least one function for useful data processing, in defining the module connecting interfaces, in establishing, by a user, an additional connection of modules (topology) corresponding to a sequence of functions suitable for useful data processing, in classifying the modules into a plurality of module types according to predefined properties, in defining connection rules indicating admissible connections for different module types according to said types of modules in programming the hardware according to said topology.

18 Claims, 16 Drawing Sheets

OTHER PUBLICATIONS

Title: CAPSULE: Hardware-Assisted Parallel Execution of Component-Based Programs, author:Pierre Palatin, dated: 2006, source: IEEE.*

Wong et al., "An Architecture for Asynchronous FPGA's," Field-Programmable Technology (FPT), 2003 Proceedings. 2003 IEEE International Conference on Dec. 5-17, 2003, Piscataway, NJ, USA, IEEE Dec. 15, 2003, pp. 170-177, XP0103688333, ISBN: 0-7803-8320-6.

"PeaCE—User's Manual (Version 1.0b)," The Cap Laboratory of Seoul National University, Nov. 25, 2004, pp. i-xviii, 1-364.

* cited by examiner

HARDWARE PROGRAMMING AND LAYOUT DESIGN

CROSS REFERENCE TO RELATED APPLICATIONS

This application claims priority to PCT Application No. PCT/EP2006/009081, filed Sep. 19, 2006, which claims priority to German Patent Application No. 10 2005 044 728.7, filed Sep. 19, 2005, the specifications and drawings of which are incorporated herein by reference.

FIELD OF THE INVENTION

The invention relates to a method for programming hardware, for example FPGAs (Field Programmable Gate Array), or for generating layouts, for example for logic circuits or integrated circuits, for instance ASICs (Application Specific Integrated Circuit) or microprocessors, for processing data, for example in the field of industrial digital image processing. Furthermore, it relates to logic circuits constructed in accordance with the principles specified in the method.

PRIOR ART

Tools used for programming hardware, for example FPGAs, include hardware description languages, such as VHDL (Very High Speed Integrated Circuit Hardware Description Language), inter alia, which make it possible to describe complicated digital systems.

One problem with most hardware description languages, however, is that hardware modules are formulated which, in terms of their interface to which the module is to be connected, make fixed, explicit assumptions about the data and control flow (protocol and data). This means that firstly hardware modules cannot be directly connected to one another without knowing the precise implementation of the modules. This is at odds with modern approaches to software development and impedes the reusability of code.

It is known that hardware modules can be connected to one another only when their precise implementation is known. The lack of compatible interfaces between modules simultaneously means a lack of portability of code from one hardware to another. The occurrence of a possible data congestion or data losses cannot be ruled out or can only be prevented with considerable outlay.

This situation currently still requires complex programming of the hardware modules, for example of FPGAs or ASICs.

Object

It is an object of the invention to improve the programming of hardware.

Solution

This object is achieved by means of the inventions comprising the features of the independent claims. Advantageous developments of the inventions are characterized in the subclaims. The wording of all of the claims is hereby incorporated in the content of this description by reference. The invention also encompasses all practical and in particular all mentioned combinations of independent and/or dependant claims.

The object is achieved by a method, inter alia. Individual method steps are described in more detail below.

The steps need not necessarily be carried out in the order indicated, and the method to be outlined can also have further steps that are not mentioned.

Firstly, for the method for programming hardware for processing user data, a plurality of modules are made available, wherein each module can execute at least one function for processing the user data. The function is determined by the user and depends on what processes are intended to be realized by the hardware to be programmed.

The term module denotes a delimited unit which is realized in hardware or represented in a higher representation language, which can execute a specific function and can communicate with other modules via interfaces. In this case, modules can be fixedly provided or can be parameterized in a flexible manner.

For this purpose, the modules are classified into a plurality of module types according to predetermined properties. The properties for the classification into different module types are selected to the effect that they comprise concrete statements about how modules can be interconnected with one another for realizing a topology (see below) or what interconnections (see below) are permissible.

The next step involves predetermining interfaces for interconnecting the modules. The principle holds true here that a data-outputting interface at the output in a first module must correspond to a data-receiving interface at the input of the next module, that is to say that the parameters of the modules in this regard must correspond.

The modules are therefore parameterized in the manner necessary for the required function and in such a way that outputs and inputs are respectively coordinated with one another in such a way that an interaction of the modules is ensured.

In detail, there are four implementations for each module:
 the parameterizable description of the module which is later synthesized, i.e. translated to the hardware;
 a simulation description of the module;
 a description of the interface (links, parameters, format, range limits, etc.);
 a description of the access interface in hardware, which specifies what parameters or registers a user can alter during the execution time in the module and how this is possible.

Concrete interconnection rules are defined depending on the module types in such a way that the data flow between the interconnected modules is controlled by means of inhibit signals. In this case, the inhibit signals can be generated by a module type. The user data flow is stopped by an active inhibit signal.

A further method step consists in predetermining an interconnection of modules (a topology) which corresponds to a sequence of functions which is suitable for processing the user data.

The hardware programming is then generated from the topology.

The models and rule systems underlying the method contain mechanisms which make it possible to formulate the hardware modules in such a way that they can be connected to one another. In this case, a programming of hardware (for example FPGAs or ASICs) can be realized by the user without precise detailed knowledge of the hardware design.

A data structure (link) comprising various signals exists at the interface of a module. They are the user data signals (DATA), and/or control signals (CTRL) the clock signal (CLK) and possibly an inhibit signal (INH).

The data exchange between the modules is carried out via the links. In principle, they produce a directional data connection, which are additionally provided with control mechanisms for data flow control. The type of data format is defined in structured manner and has to correspond between transmitter and receiver.

In this case, the user data signals transport the user data. They can be constructed and structured as desired. In particular, nested structures are also permissible in this case.

The control signals communicate additional information at the same time as the user data signals. The control signals must reveal the validity of the user data. A specific individual signal or else a combination of a plurality of signals can be used for this purpose. One example of a CTRL signal is, inter alia, a valid for a data variable.

Input links are defined for receiving data and output links are defined for outputting data.

In this case, the interfaces enable an output of a first module to be connected to an input of a second module. A data structure of the output link type is provided for each output of a module, while a data structure of the input link type is provided for each input of a module.

In the case of an input link, all the data and control signals and also the clock signal are input signals, but the inhibit signal is an output signal. In the case of an output link, all the data and control signals and also the clock signal are outputs, but the inhibit signal is an input. All changes in the signals take place synchronously with the clock. Input and output links can only be connected to one another if they use the same clock.

The correct processing of incoming data is realized by at least one function logic in a module. The function logic is a function serving for processing the data and realized in hardware.

On the output side, a module is characterized by an output latency. The output latency is a module property and is determined and made available by the programmer of the module. There are modules having constant output latencies, but also modules in which the output latencies depend on the settings of the parameters. The output latency of a module specifies what maximum number of valid data words the output link can still transmit if no more new data arrive, that is to say how many data a module can still transmit if it is stopped. This number must always be able to be taken up by the downstream processing chain if no data loss is to occur. If this is not ensured by the modules used, then the corresponding control elements in the form of delay or buffer or FIFO elements are automatically inserted in order to ensure this state.

The data streams between the modules are generated by source modules, processed and altered by processing modules and accepted by sink modules. The connection of these modules via the links generates a self-regulating network of data flows. The principles of this regulating circuit and the possible topologies of the network are defined by the rule system according to the invention. The rule system is designed in such a way that not only are the local connections adapted among one another in terms of data flow and data format, but also it is guaranteed that the total data flow is trans-ported without any losses by the design (topology).

As described above, various module types each having concrete properties are defined for the method according to the invention. For differentiation, the modules are designated here as modules of the types "O" (O module), "P" (P module) and "M" (M module). The type designation in each case identifies both the properties of a module and the interconnection rules thereof. The choice of names is arbitrary.

O module

O modules are the simplest modules. An O module can change the values of user data but cannot erase user data.

The control data flow is not influenced by the O module.

The inhibit signal contained in a link has no influence on the O module.

The data, when passing through the O module, experience a delay (latency) with a precisely defined number of clock cycles, which generally corresponds to the number of register stages which the user data pass through on the data path from the input link to the output link.

An O module is therefore a deterministic module with precisely N clock cycles.

If an O module has a plurality of input links, then the user data must be present at them in phase. In the case of an O module having a plurality of input links, the inhibit signal is conducted identically onto all the input links.

On account of its properties, an O module cannot cause any data congestion nor any loss of data. In the case of an O module, the volume of user data does not change, but the data values can indeed change, e.g. as a result of addition. No data are erased or generated.

The number of valids likewise does not change. In the case of an O module, not all of the register stages have to contain actually valid data.

P Module

A further module type used for the method described is the P module. It has a more complex character than an O module.

A P module can change the values of user data and erase user data. A P module has, in particular, the possibility of supplying fewer data words than it receives.

Likewise, the P module can change and erase the control data flow. On account of its properties, a P module can influence the control data flow, but only in such a way that the absolute data rate is reduced. As a result of this, the number and the temporal position of the control signals including data valid are variable. In other words: a P module can alter the valid stream in that it can reduce the number of valids.

An inhibit signal has no influence on the P module.

The data experience a precisely defined maximum delay (maximum latency) when passing through the P module. In this case, the delay experienced by individual user data can also be less than the maximum delay. A P module is therefore likewise a deterministic module with max. N clock cycles.

In the case of a P module having a plurality of input links, the data must be present at them in phase. In this case, the function logic is fed with control data from at least one of the input links. In the case of a P module having a plurality of input links, the inhibit signal is conducted identically onto all the input links.

After the input data flow has stopped, a P module can maximally supply the number of data words which is defined by the output latency.

In the case of an active inhibit signal, as many data words as desired can still be taken up by the module. An inhibit signal passes through a P module without any delay. That is to say that a P module simply only forwards an inhibit. It does not alter the inhibit stream. This is not necessary moreover, since a P module can only ever reduce, but not increase, the data stream. An active control of the inhibit signal is respectively necessary only when more data can be generated than were received, or when an indeterminate delay can occur, such that it may be necessary to stop the chain on the input side because the data are no longer taken away on the output side.

One example of a P module is, inter alia, the conversion of 24 bit RGB image data into 32 bit interleaved image data. The number of data words and therefore of control signals is reduced in a process of this type.

M Module

A third module type used for the method described is the M module. The latter is the most complex of the modules proposed.

The M module can change the values of user data, erase user data and generate new user data.

The M module can change, erase and generate the control data flow.

Furthermore, the M module can generate an inhibit signal.

The data experience an indeterminate delay when passing through the M module. Therefore, an M module is a non-deterministic module.

On their respective input side, M modules have an input buffer with a specific buffer size for storing data.

This buffer size of the input link of a module determines what maximum number of valid data words the link can still take up after the inhibit signal has been activated.

In the case of an M module having a plurality of input links, incoming user data and also control data can originate from independent sources (input links).

On account of its properties, an M module can explicitly influence the data flow, wherein the data flow can also be completely stopped. The data flow is controlled by means of inhibit signals. In the case of an activated inhibit signal, at most the number of data words determined by the output latency of the M module can still be output. The number and the temporal position of the control signals including data valid is variable. An M module can supply fewer or more data words than it receives.

As described above, all changes of signals take place synchronously with the clock. However, this does not mean a restriction to systems which have only a single clock. While O and P modules require the same clock signal at the input and output links, M modules can process different clock signals (CLK signals) on the input and output side. The synchronization of the data with regard to the different input and output clocks is performed in the M module. Consequently, it is also possible to generate hardware descriptions with a plurality of different synchronous clock signals.

Interconnection

The interconnection of modules of the different module types described is effected according to concrete rules specific to each module type.

The interconnection of the output of an O or P module with the input of a succeeding O or P module, that is to say a series connection of these modules, is possible in unrestricted manner. The maximum output latency of the overall arrangement results from the sum of the maximum output latencies of the individual modules. After an active inhibit signal, the overall arrangement can still take up as many data as desired.

In the case of the interconnection of the output of an O or P module with the input of an M module (series connection) the buffer size of the M module must be greater than the output latency of the O or P module. Otherwise, a buffer which can temporarily store the excess data words must be inserted. This is carried out automatically. After an active inhibit signal the overall arrangement can only take up as many data as specified by the buffer size and a possibly inserted buffer. The output latency of the overall arrangement corresponds to the output latency of the M module.

The interconnection of the output of an M module with the input of an O or P module (series connection) is possible in unrestricted manner. After an active inhibit signal, the overall arrangement can only take up as many data as specified by the buffer size of the M module. The order is important when determining the maximum output latency of the overall arrangement:

a) O/P-M: the M module decouples the logic of the 0 module and reacts to an inhibit in the topology on the right of this combined module. Therefore, in this arrangement the M module alone determines the output latency of the interconnection.

b) M-O/P: here the output latency of the M module is added to the maximum output latency of the O or P module.

If the output of a first M module is interconnected with the input of a second M module (series connection), then in this case the buffer size of the second M module must be at least as large as the output latency of the first M module. Otherwise, a buffer which can temporarily store the excess data words must be inserted, which is effected automatically. After an active inhibit signal, the overall arrangement can only take up as many data as specified by the buffer size of the first M module. The output latency of the overall arrangement corresponds to the output latency of the second M module.

In the case of parallel connections of different module types, a crucial factor is to the inputs of what module type the outputs of the parallel-connected modules are brought together again.

In the case of an O or P module, the CTRL signals of all the input links must be synchronous. Therefore, extremely stringent requirements are applicable here. Thus, in the case of parallel connection of a first and at least one second O module whose outputs are interconnected with the inputs of a third O or P module, it is necessary to insert, downstream or upstream of the first or second O module depending on which has the smaller output latency, a delay register having a number of stages equal to the difference in the output latencies of the first and second O modules, in order that synchronization of the data remains ensured at the inputs of the third module. In this case, the output latency of the overall arrangement corresponds to the sum of the maximum output latency of the parallel-connected O modules and the maximum output latency of the series-connected O or P module.

A parallel connection of a first P or M module with at least one second P or M module whose outputs are interconnected with the inputs of a third O or P module is impermissible. This results from the fact that P and M modules do not have a fixedly defined latency, such that an in-phase state of the data cannot be achieved.

A parallel connection of a first O, P or M module with at least one second O, P or M module whose outputs are interconnected with the inputs of a third M module is permissible, however.

In the case of M modules, the CTRL signals of all the input links can be independent. Therefore, all combinations are permissible here. No latency compensation of the individual paths is performed. The data flow control is effected exclusively on the basis of CTRL and INH signals.

The method proposed is also characterized, inter alia, in that a check is made to determine whether the interconnection rules are complied with by the topology. If errors are detected, then either they are reported or the topology is supplemented—if possible—in such a way that the interconnection rules are fulfilled. Design errors are thereby minimized.

Moreover, a nesting of module arrangements can be effected in the method proposed. In this case, the function logic of a module is constructed from an arrangement of a plurality of modules. Arbitrarily deep structures are possible in the case of the nesting. In order to be able to realize such arrangements, connections between input links and connections between output links must be permissible.

Possibly required delay elements and buffers are likewise inserted automatically in the case of such nesting. As a result, data losses, data congestion or deadlock situations can never occur. Overall, the design has a low error probability.

The method according to the invention is created in such a way that there is the possibility of creating a plurality of nestings and interconnections of modules (components) for realizing the predetermined function in each case, from which a library can be constructed.

Graphical symbols can be used for representing modules for processing user data. This affords the possibility of creating a topology from modules and components from a library on a graphically oriented basis according to the modular principle.

Graphical Editor

The object is also achieved by means of a graphical editor for programming hardware for processing user data with graphical symbols for representing modules, wherein each module can execute a function for processing the user data if the module is realized in hardware.

The editor has graphical symbols for representing different module types, wherein the modules can be classified according to predetermined properties in accordance with the module types.

The editor has at least one graphical symbol for representing interfaces for interconnecting the modules. Furthermore, it has means for checking whether a permissible interconnection of modules is present in accordance with predetermined interconnection rules, wherein the interconnection rules are defined depending on the module types in such a way that the data flow between the interconnected modules is controlled by means of inhibit signals. In this case, the inhibit signals can be generated by a module type. The user data flow is stopped by an active inhibit signal.

The editor has graphical means for establishing a graphical representation of an interconnection of modules (topology) which corresponds to a sequence of the functions which are suitable for processing the user data. Furthermore, it has means for translating the graphical representation of the topology into a programming of the hardware.

Computer Program

The object is furthermore achieved by means of a computer program which executes the method according to the invention or the graphical editor in one of its configurations when said program is executed on an processing unit, a microcontroller, DSP, FPGA or computer or a plurality thereof in a network. Furthermore, the object is achieved by means of a computer program comprising program code means for carrying out the method according to the invention in one of its configurations or for realizing the graphical editor if the program is executed on an processing unit, a microcontroller, DSP, FPGA or computer or on a plurality thereof in a network. In particular, the program code means can be instructions stored on a computer-readable data carrier.

Moreover, the object is achieved by means of a data carrier on which is stored a data structure which can execute the method according to the invention or the graphical editor in one of its configurations after being loaded into a working and/or main memory of an processing unit, of a microcontroller, DSP, FPGA or computer or a plurality thereof in a network.

The object is achieved by means of a computer program product comprising program code means stored on a machine-readable carrier for carrying out the method according to the invention in one of its configurations or for realizing the graphical editor if the program is executed on an processing unit, a microcontroller, DSP, FPGA or computer or on a plurality thereof in a network.

In this case, a computer program product is understood to mean the program as a commercial product. It can be present in principle in any desired form, thus for example on paper or a computer-readable data carrier, and can be distributed in particular by means of a data transmission network.

Finally, the object is achieved by means of a modulated data signal which contains instructions for executing the method according to the invention or the graphical editor in one of its configurations, which instructions can be executed by an processing unit, a microcontroller, DSP, FPGA or computer or by a plurality thereof in a network.

An appropriate computer system for executing the method or for realizing the graphical editor includes both a standalone computer or microcontroller, DSPs or FPGAs and a network of microcontrollers, DSPs, FPGAs or computers, for example an in-house closed network, or else computers which are connected to one another via the internet. Furthermore, the computer system can be realized by a client-server constellation, wherein parts of the invention run on the server, and others on a client.

Logic Circuit

The object is also achieved by means of a logic circuit obtained by the described method in one of its configurations.

Furthermore also by means of a logic circuit for processing user data comprising a plurality of modules, wherein each module can execute at least one function for processing the user data. In this case, the modules can be classified into a plurality of module types according to predetermined properties. The logic circuit furthermore has predetermined interfaces for interconnecting the modules. The interconnections between the modules are realized depending on the module types in such a way that the data flow between the interconnected modules is controlled by means of inhibit signals, wherein the inhibit signals can be generated by a module type, and wherein the user data flow is stopped by an active inhibit signal. The logic circuit is realized by an interconnection of the modules which corresponds to a sequence of the functions which is suitable for processing the user data.

Further details and features will become apparent from the following description and preferred exemplary embodiments in conjunction with the subclaims. In this case, the respective features can be realized by themselves alone or as a plurality in combination with one another. The possibilities for achieving the object are not restricted to the exemplary embodiments.

The exemplary embodiments are illustrated schematically in the figures. Identical reference numerals in the individual figures in this case designate elements which are identical or functionally identical or correspond to one another with regard to their functions. In detail:

DETAILED DESCRIPTION

LINKS

Figure 1:
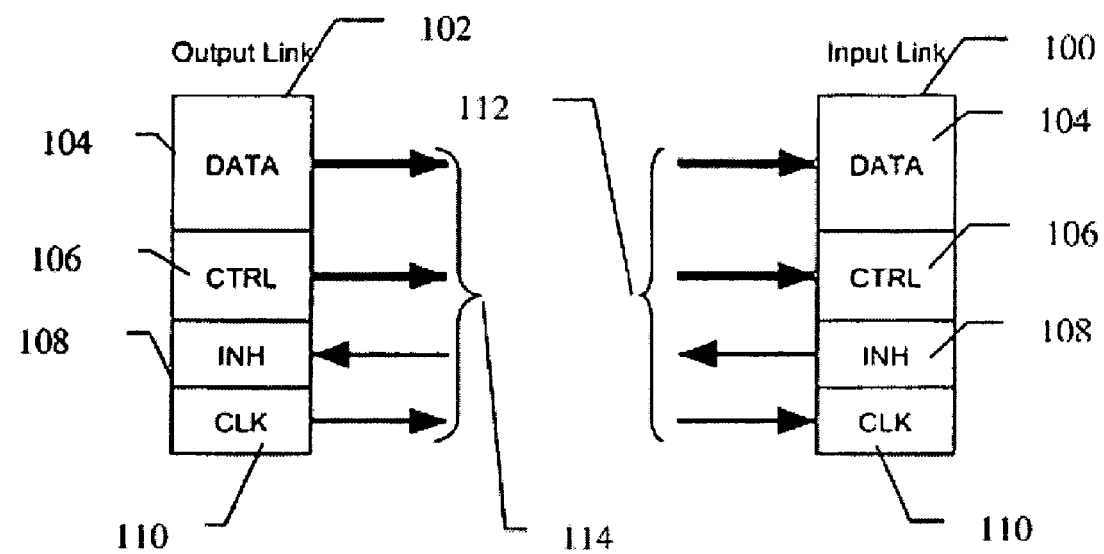
FIG. 1 shows a schematic representation of the data structure of an input link and of an output link.

FIG. 1 schematically shows the data structure of an input link 100 and of an output link 102. A link 100, 102 is a data structure comprising data signals (DATA) 104, control signals (CTRL) 106, an inhibit signal (INH) 108 and also a clock signal (CLK) 110.

In the case of an input link 100, the direction of the signal flow 112 is characterized by the fact that all the data and control signals 104, 106 and also the clock signal 110 are input signals, while the inhibit signal 108 is an output signal. By contrast, in the case of an output link 102, the direction of the signal flow 114 is characterized by the fact that all the data and control signals 104, 106 and also the clock signal 110 are output signals, while the inhibit signal 108 is an input signal.

The data signals 104 transport the user data. They can be constructed and structured in any desired manner. In particular, nested structures also permissible in this case. The control signals 106 communicate additional information at the same time as the data signals 104.

The control signals 106 must reveal the validity of the user data. A specific individual signal or else a combination of a plurality of signals can be used for this purpose.

O Module

Figure 2:
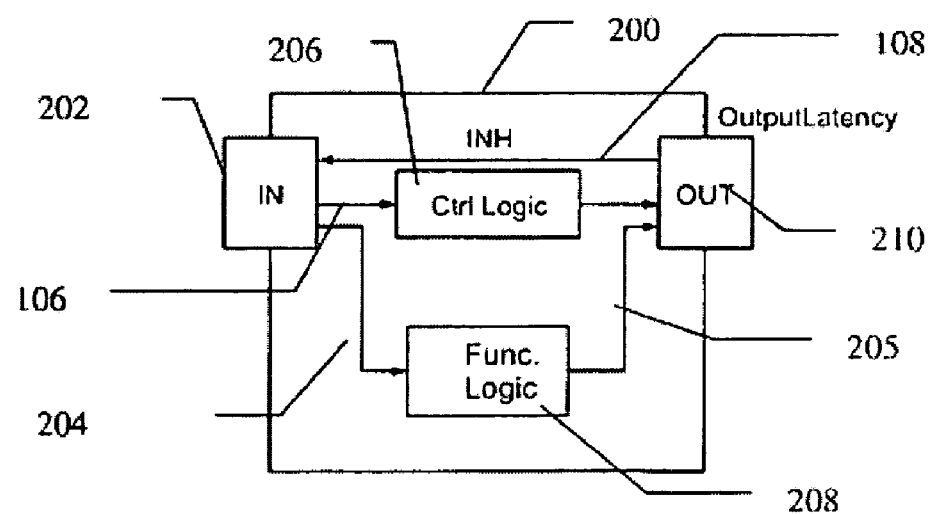
FIG. 2 shows a schematic representation of an O module with one input link.

FIG. 2 shows the processing of the different signals contained in the data structure of an input link 100 by an O module 200 with one input link 202.

The data flow of the control signals 106 present at the input link 202 of the O module 200 is not influenced by the O module 200. The user data flow is altered, however. In this case, the user data 104 experience a precisely defined delay (latency) when passing through the module 200. This generally corresponds to the number of register stages which the user data pass through on the data paths 204, 205 via the function logic 208 from the input link 202 to the output link 210. After the input data flow 104 has been stopped, the O module 200 can still maximally supply as many data as determined by the output latency.

Figure 3:
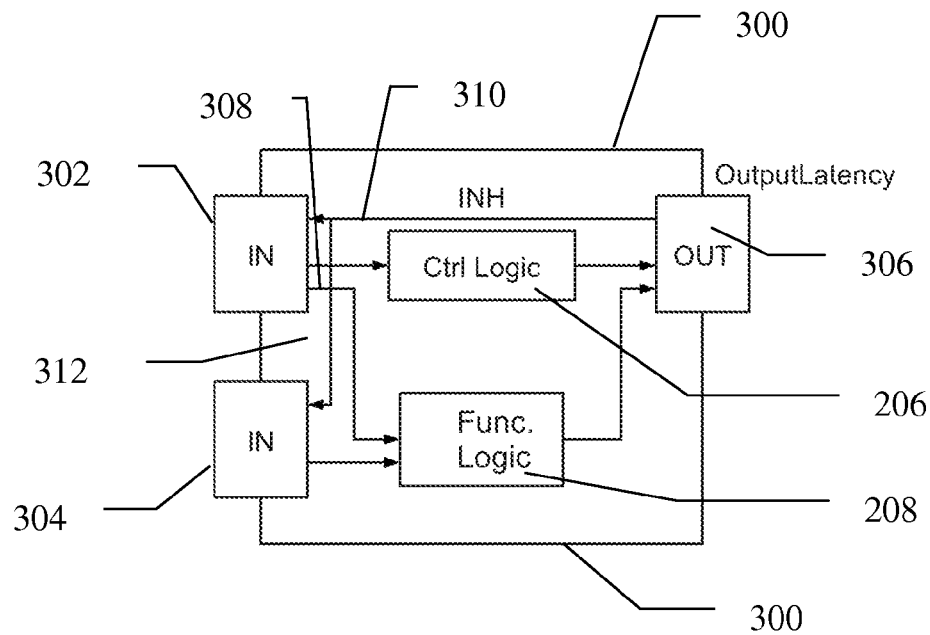
FIG. 3 shows a schematic representation of an O module with two input links.

FIG. 3 supplementarily shows the special features of an O module with a plurality of input links 302 and 304. In this embodiment of the Q module 300, the data must be present in phase. It is assumed that the CTRL signals 106 including data valid originate from the same source. As a result, the automatically generated CTRL logic 206 only has to be fed from an arbitrarily chosen one of the input links 302 or 303, for example 302. The inhibit signal is conducted identically onto the input links 302, 304 via the data paths 310, 312.

P Module

Figure 4:
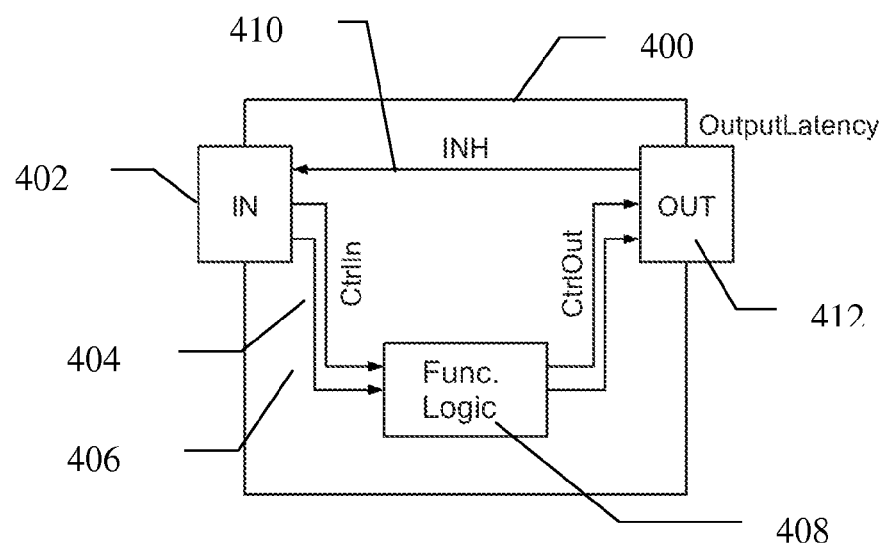
FIG. 4 shows a schematic representation of a P module with one input link.

FIG. 4 shows the processing of the different signals contained in the data structure of an input link 100 by a P module 400 with one input link 402.

The data flow of the control signals 106 present at the input link 402 of the P module 400 can be influenced by the P module 400, but only by the absolute data rate being reduced. The data paths 404, 406 both of the control data 106 and of the user data 104 therefore run via the function logic 408 in the case of the P module.

The number of the temporal position of the control signals 106 including data valid can therefore vary. A consequence of this is that the P module 400 can in particular supply fewer data words than it receives.

The inhibit signal 108 is processed in the function logic 408. The data path 410 of the inhibit signal runs directly from the output link 412 to the input link 402 of the P module, as a result of which the inhibit signal 108 is not used in the function logic 408 of the P module 400.

Figure 5:
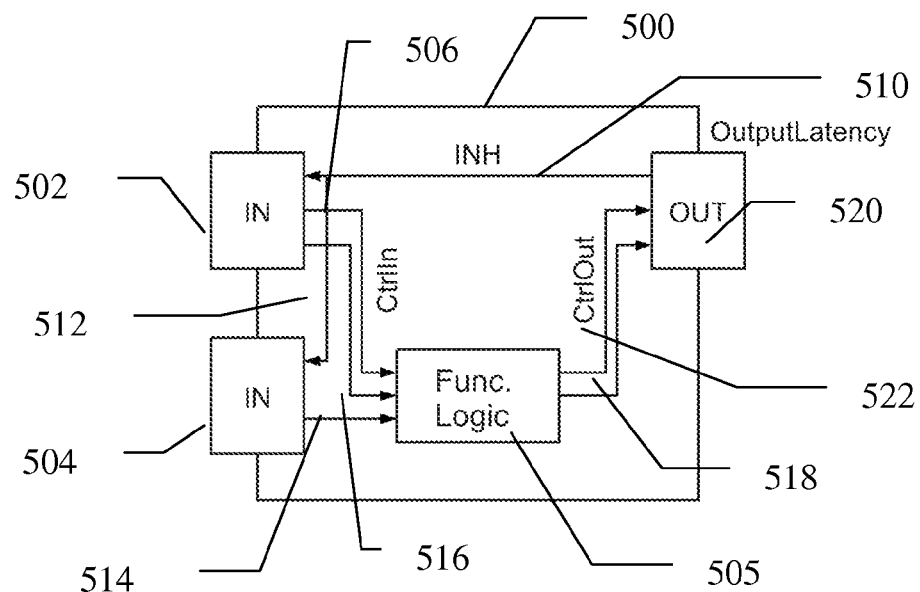
FIG. 5 shows a schematic representation of a P module with two input links.

In the case of a P module 500 with a plurality of inputs as illustrated in FIG. 5, it is assumed that the control signals present at the input links 502 and 504 originate from one source. The function logic 505 is therefore only fed from an arbitrarily chosen one of the input links 502 or 504, for example 502, via the data path 506. The inhibit signal 108 is conducted onto the input links 502, 504 identically via the data paths 510, 512. In this embodiment of the P module 500, the data must be present in phase. The user data are passed via the data paths 514, 516 to the function logic and further via the data path 518 to the output link 520, while the control signals 106 are passed via the data path 522 to the output link.

M module

Figure 6:
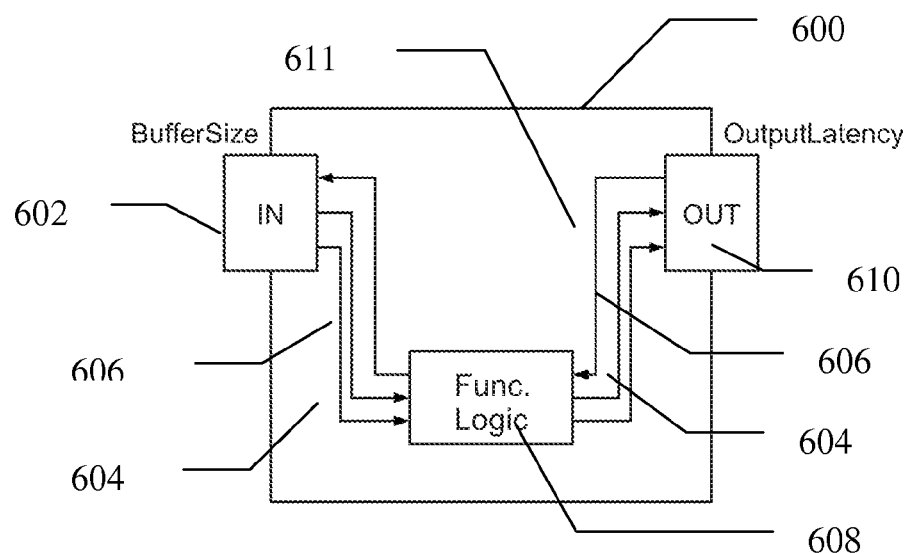
FIG. 6 shows a schematic representation of an M module with one input link.

An M module 600 illustrated in FIG. 6 can greatly influence the control flow, and indeed even completely stop it. From the input link 602 of the module 600, the data paths 604, 606 of the useful and control data 104 and 106, respectively, run via the function logic 608 to the output link 610 of the M module 600. The data path 611 of the inhibit signal runs from the output link 610 via the function logic 608 to the input link 602. After the data flow has been stopped, the M module 600 can maximally take up a number of data words such as is determined by the size of the buffer present at the input link of the module (buffer size).

Figure 7:
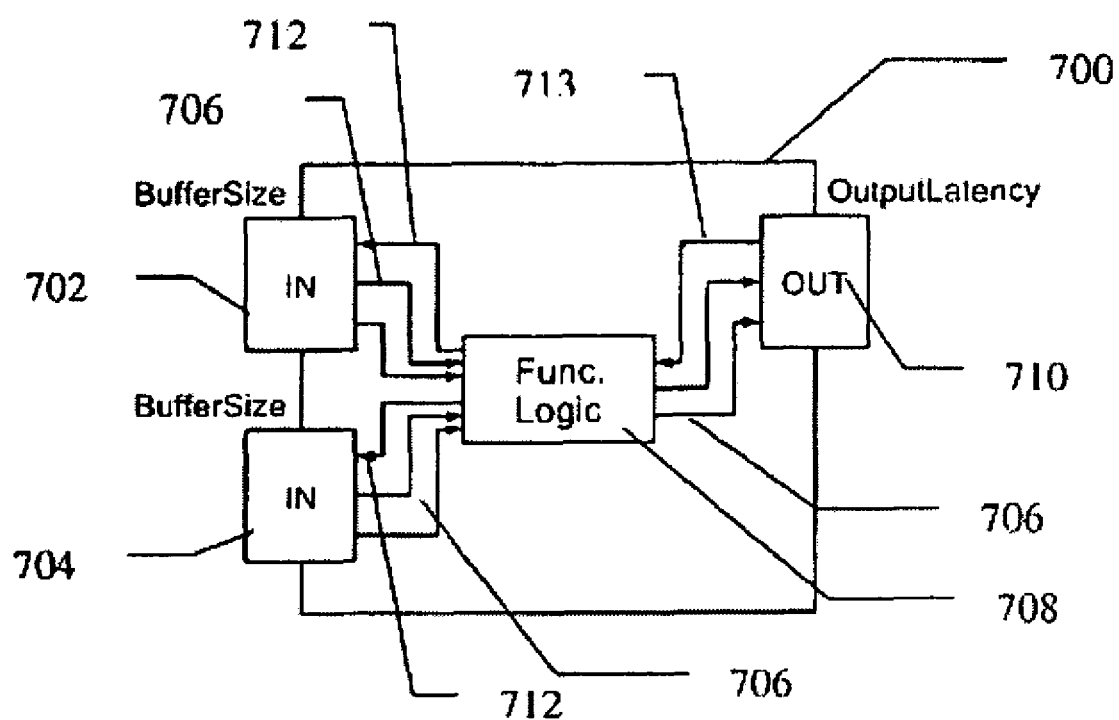
FIG. 7 shows a schematic representation of an M module with two input links.

In the case of an M module 700 in accordance with FIG. 7 with a plurality of input links 702, 704, it is assumed that the control signals can originate from independent sources. Therefore, the control signals 106 are passed from all the input links 702, 704 via the data paths 706 to the function logic 708 and further to the output link 710 of the M module 700. The inhibit signals 108 are likewise passed via the data paths 712 from the output links 710 to the input links 702, 704. The function logic 708 realizes the correct processing and possibly buffer-storage of data arriving in offset manner.

Interconnection

Figure 8:
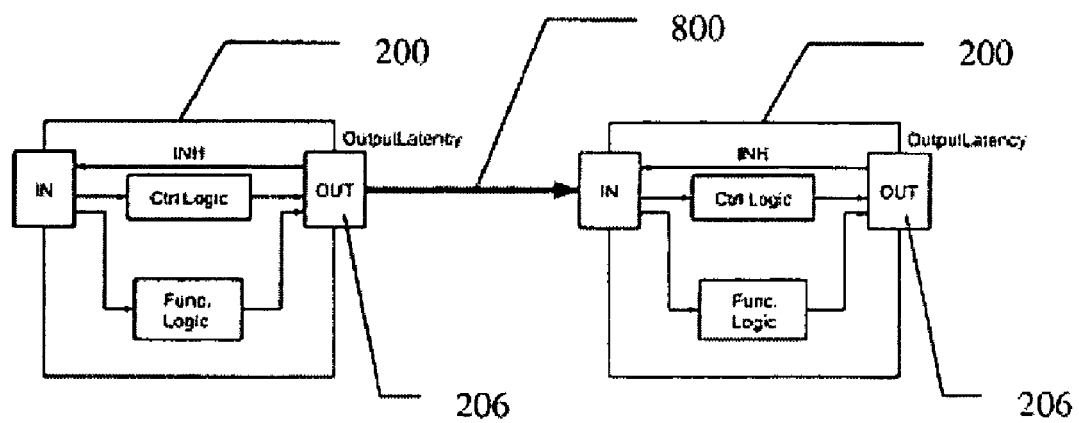
FIG. 8 shows a schematic representation of the series connection of the output of an O module to the input of an O module.

FIG. 8 shows a series connection of two O modules 200. The output 206 of the first O module 200 is interconnected with the input 202 of the second O module 200 via the data path 800. The output latency of the entire circuit arrangement results from the sum of the output latencies of the individual modules. After an active inhibit signal, the overall arrangement can still take up as many data as desired.

Figure 9:
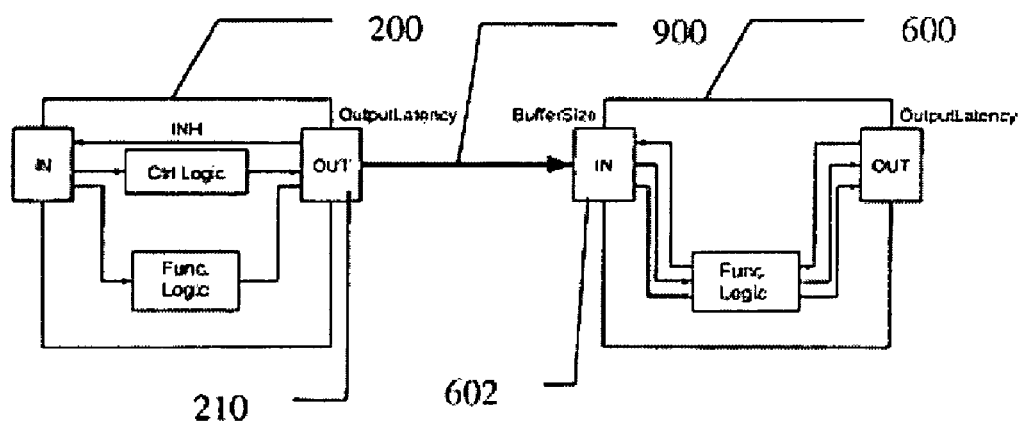
FIG. 9 shows a schematic representation of the series connection of the output of an O module to the input of an M module.

FIG. 9 shows a series connection of an O module 200 with an M module 600. In this case, the output 210 of the O module 200 is interconnected with the input 602 of the M module via the data path 900. In the case of this interconnection, the buffer size at the input link 602 of the M module 600 must be at least as large as the output latency of the O module. Otherwise, a buffer which can temporarily store the excess data words must be inserted. This is carried out automatically. After an active inhibit signal, the overall arrangement can only take up as many data as specified by buffer size at the input link 602 and a possibly inserted buffer. The output latency of this overall arrangement corresponds to the output latency of the M module 600.

Figure 10:
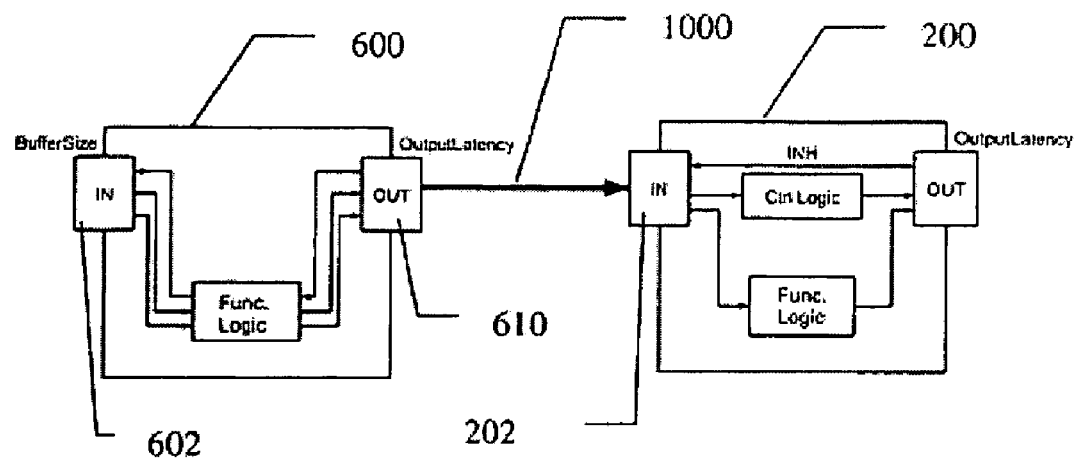
FIG. 10 shows a schematic representation of the series connection of the output of an M module to the input of an O module.

FIG. 10 shows the series connection of an M module 600 with an O module 200. In this case, the output 610 of the M module 600 is interconnected with the input 202 of the O module via the data path 1000. After an active inhibit signal, the overall arrangement can only take up as many data as specified by the buffer size at the input 602 of the overall arrangement. The output latency of the overall arrangement results from the sum of the output latencies of the individual modules.

Figure 11:
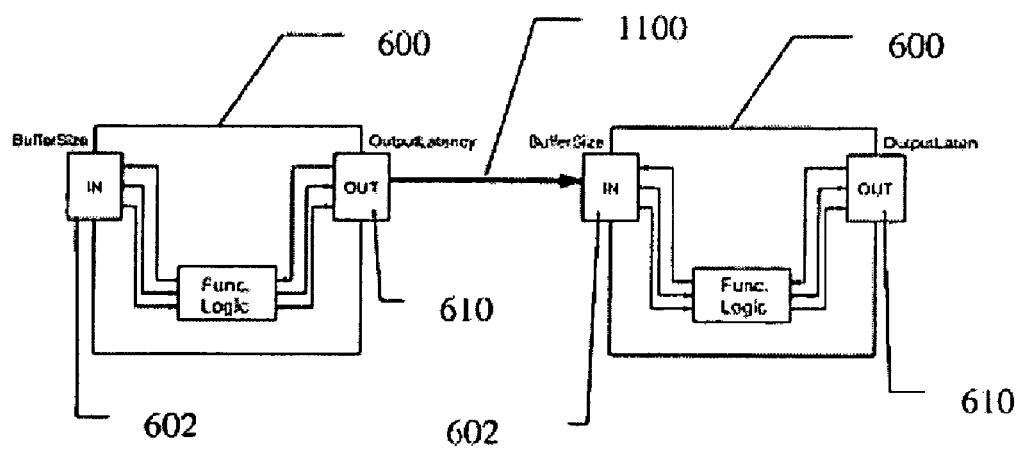
FIG. 11 shows a schematic representation of the series connection of the output of an M module to the input of an M module.

FIG. 11 shows the series connection of a first M module 600 with a second M module 600. In this case, the output 610 of the first M module 600 is interconnected with the input 602 of the second M module via the data path 1100. In this case, the buffer size at the input link 602 of the second M module 600 must be at least as large as the output latency at the output link 610 of the first M module. After an active inhibit signal, the overall arrangement can only take up as many data as specified by the buffer size at the input link 602 of the first M module. The output latency of this overall arrangement corresponds to the output latency of the second M module 600.

Figure 12:
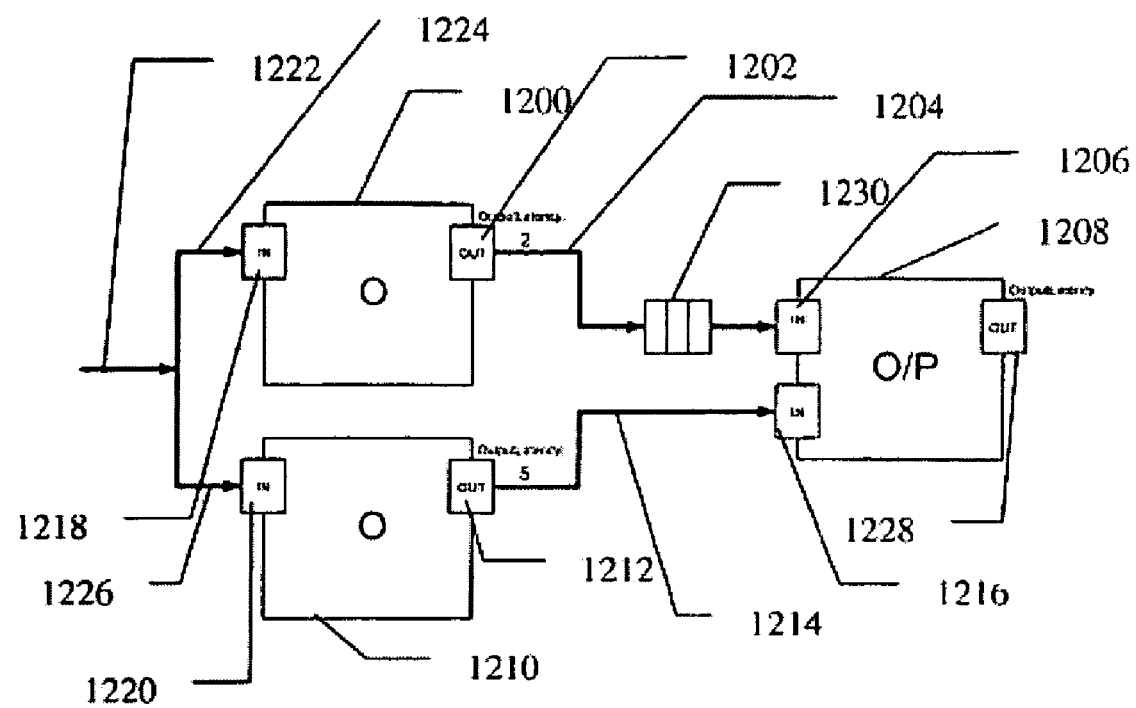
FIG. 12 shows a schematic representation of the parallel connection of two O modules in the case of interconnection of the outputs of the parallel modules respectively with an input of an O or P module.

FIG. 12 shows the parallel connection of two O modules. In this case, a first O module 1200 is interconnected via its output 1202 with a first input 1206 of a second or P module 1208 via the data path 1204. In parallel therewith a second O module 1210 is interconnected by its output 1212 with a second input 1216 of the module 1208 via the data path 1214. The inputs 1218 and 1220 of the two parallel O modules 1200 and 1210 are fed via the data paths 1222, 1224, 1226. In the case of an O or P module, the CTRL signals and all the input links must be synchronized. Extremely stringent requirements are therefore applicable in the case of this arrangement. The output latency at the output 1228 of the overall arrangement results from the sum of the maximum output latencies of the parallel connection and the maximum output latency of the series-connected O or P module. After an active inhibit signal, the overall arrangement can still take up as many data as desired. Downstream of the module having the smaller output latency it is necessary to insert, for compensation purposes, a register 1230 having a number of stages equal to the difference with respect to the maximum output latency. This is three register stages in the example illustrated.

Figure 13:
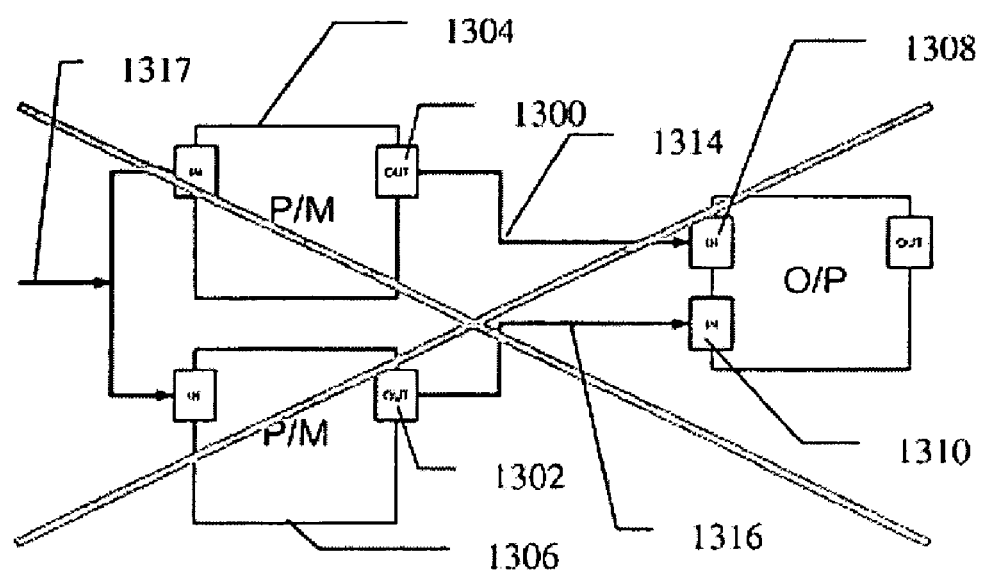
FIG. 13 shows a schematic representation of the impermissible parallel connection of two P or M modules in the case of interconnection of the outputs of the parallel modules respectively with an input of an O or P module.

The arrangement illustrated in FIG. 13 shows the interconnection of the outputs 1300, 1302 of two parallel-connected P and/or M modules 1304, 1306 with respectively an input 1308, 1310 of an O or P module 1312 via the data paths 1314, 1316. The parallel-connected modules are fed from the same data source via the data path 1317. Such an arrangement is not permissible since the P and/or M modules 1304, 1306 do not have a fixedly defined delay, such that an in-phase state of the data at the outputs 1300, 1302 of the two parallel-connected P or M modules 1304, 1306 or at the inputs 1308 and 1310 of the downstream O/P module cannot be achieved. This circuit is not permissible because the two parallel-connected P or M modules 1304, 1306 are fed from the same data source. A deadlock can occur in this case.

If the data sources of the parallel-connected modules are independent of one another, then this bringing together is permitted in a special case. A synchronization module which renders the two data streams in phase is required for this purpose.

Figure 14:
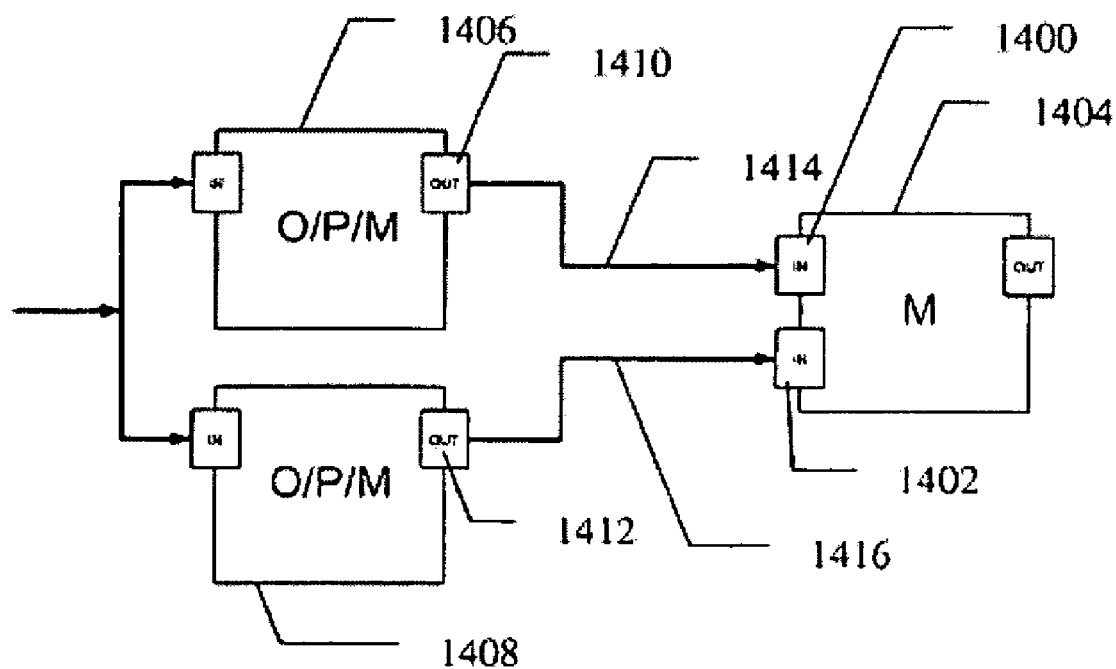
FIG. 14 shows a schematic representation of the parallel connection of two O, P or M modules in the case of interconnection of the outputs of the parallel modules respectively with an input of an M module.

In the case of the arrangement illustrated in FIG. 14, the control signals of all the input links at the inputs 1400, 1402 of the M Module 1404 can be independent of one another. Here the parallel connections of all combinations of O and/or P and/or M modules 1406, 1408 are possible, the outputs 1410, 1412 of which are brought together at the inputs 1400, 1402 of the M module 1404 via the data paths 1414, 1416. As described above, no latency compensation of the individual paths is performed in the case of this variant of the parallel interconnection of modules. Here the data flow control is effected exclusively on the basis of the CTRL and INH signals.

Figure 15:
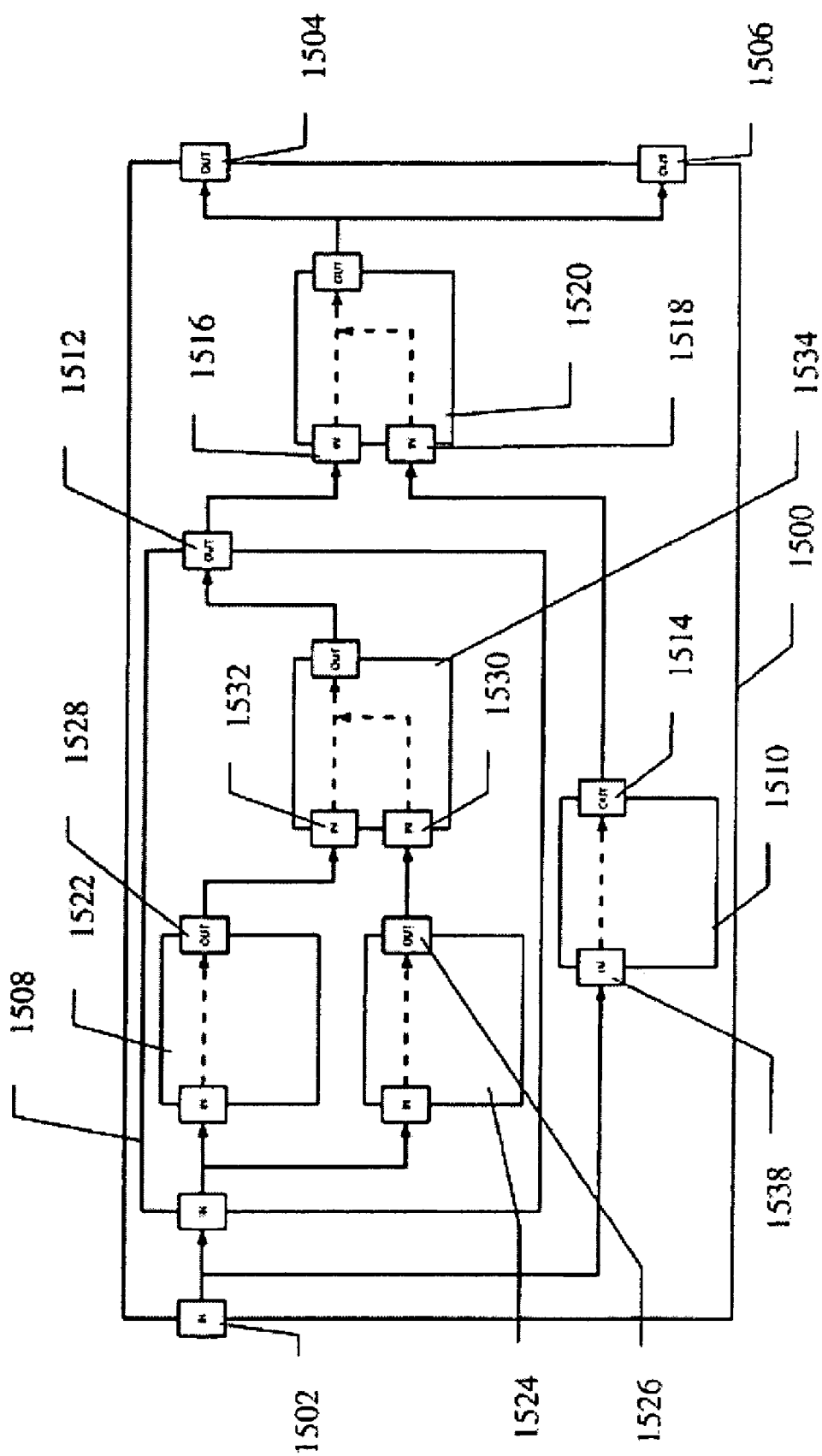
FIG. 15 shows a schematic representation of a nesting of hardware modules.

FIG. 15 schematically shows an example of the nesting of module arrangements. The module 1500 has one input 1502 and two outputs 1504, 1506. The module 1500 contains a nested arrangement of two parallel-interconnected modules 1508, 1510, the respective output 1512, 1514 of which are interconnected with the inputs 1516, 1518 of a third module 1520. In the case of this arrangement, the module 1508 in turn contains a parallel connection of two modules 1522, 1524, the outputs 1526, 1528 of which are interconnected with the inputs 1530, 1532 of a third module 1534.

Figure 16:
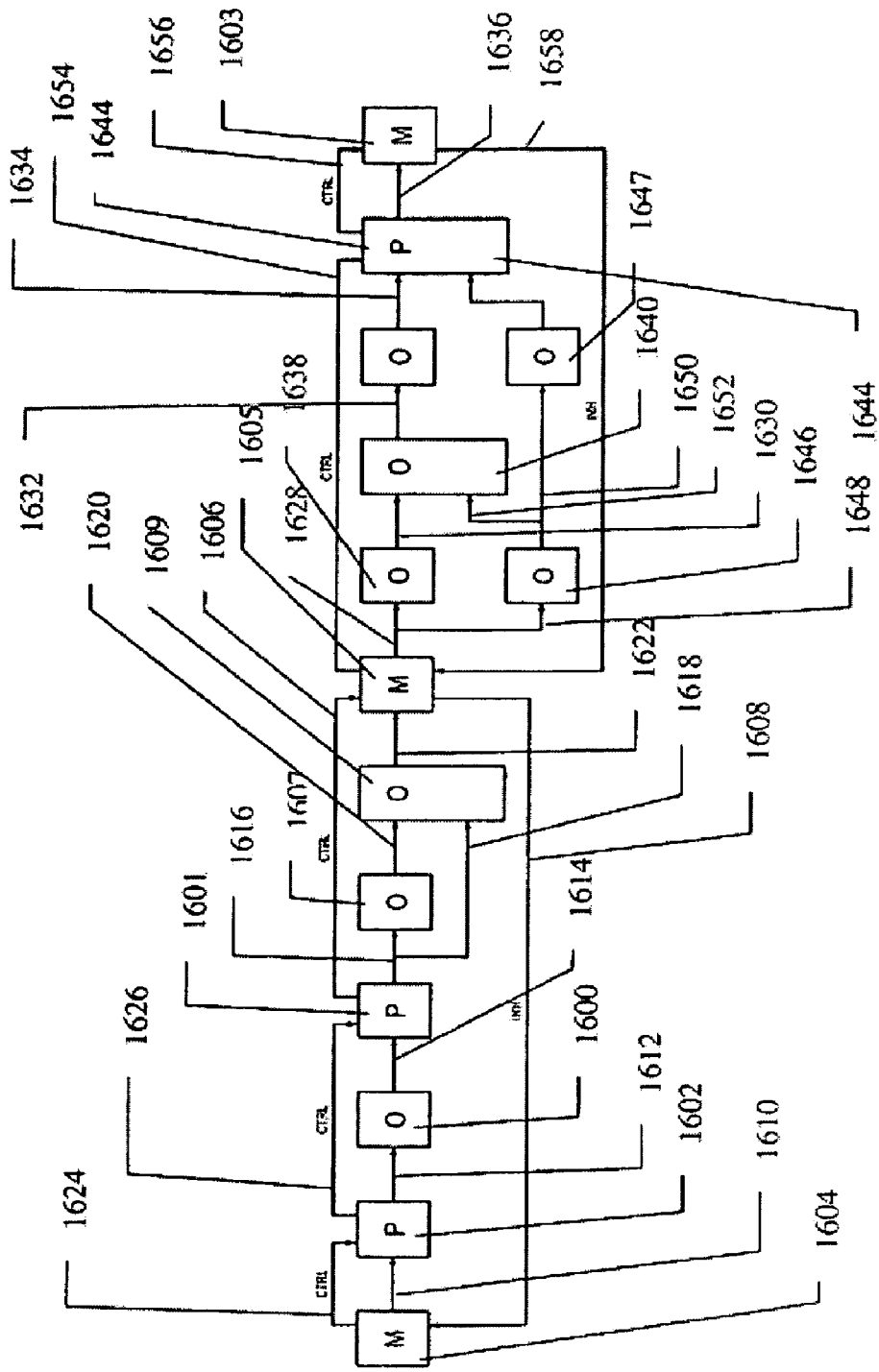
FIG. 16 shows a schematic representation of an example of an interconnection of hardware modules (topology)

One example of a topology of modules is illustrated schematically in FIG. 16.

A topology with a plurality of O, P and M modules is shown in this case. The data flow runs from the M module 1604 via the data paths 1610, 1612, 1614, 1616, 1618, 1620 and 1622 to the M module 1605. In this case, in the order M module 1604, P module 1602, O module 1600, P module 1601, O module 1607, O module 1609 and M module 1605 are serially interconnected with one another via said data paths. Between P module 1601 and O module 1607, the data path branches and runs via data path 1618 to a second input of the O module 1609. The CTRL signals run from the M module 1604 via the data path 1624 to the P module 1602, from the P module 1602 via the data path 1626 to the P module 1601, from the latter via the data path 1606 to the M module 1605. An inhibit signal runs via the data path 1608 from the M module 1605 to the M module 1604. From the M module 1605, the data flow runs via the data paths 1628, 1630, 1632, 1634 and 1636 to the M module 1603. In this case, in the order M module 1605, O module 1638, O module 1640, O module 1642, P module 1644 and M module 1603 are serially interconnected with one another via said data paths. Between the M module 1605 and the O module 1638, the data flow branches to the O module 1646 via the data path 1648. A further branching is effected between the O modules 1646 and 1647 via the data path 1652 to the O module 1640. From the O module 1646, the data flow runs via the data path 1650 to the O module 1647 and further via the data path 1652 to the P module 1644. From the P module, the data flow runs via the data path 1636 to the M module 1603. The CTRL signals run from the M module 1605 to the P module 1644 and also from the P module 1644 to the M module 1603. The inhibit signal is transferred via the data path 1658 from the M module 1603 to the M module 1605.

For the relation of links to modules, the various possible configurations are shown schematically in FIGS. 17 to 22.

Figure 17:
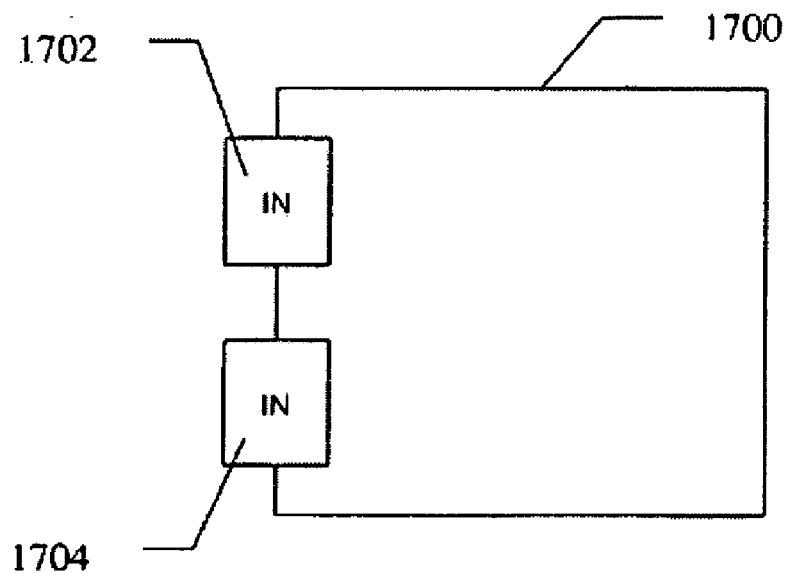
FIG. 17 shows a schematic representation of a module with one or a plurality of input links.

FIG. 17 shows a module 1700 having only one or a plurality of input links 1702, 1704. This involves modules which can only take up data. This may be for example a DMA channel (direct memory access). The module represents a data sink.

Figure 18:
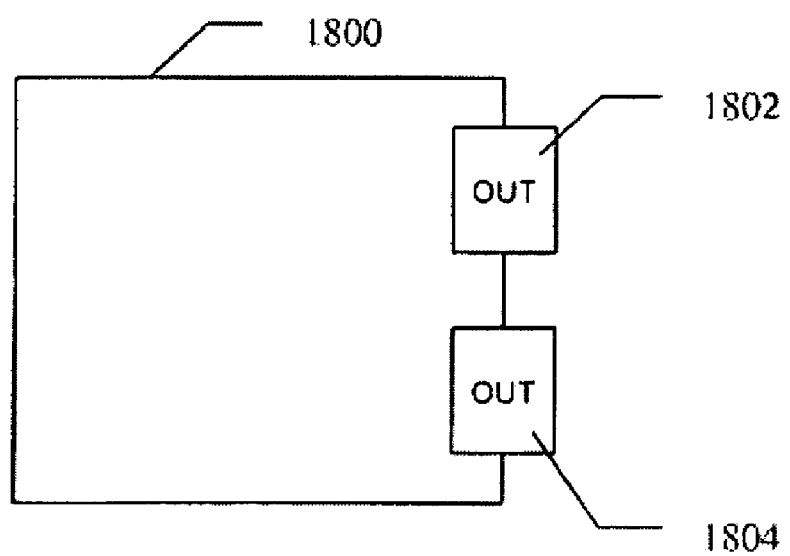
FIG. 18 shows a schematic representation of a module with one or a plurality of output links.

A module 1800 having only one or having a plurality of output links 1802, 1804 is shown in FIG. 18. By way of example, this may be a camera, that is to say a data source.

Figure 19:
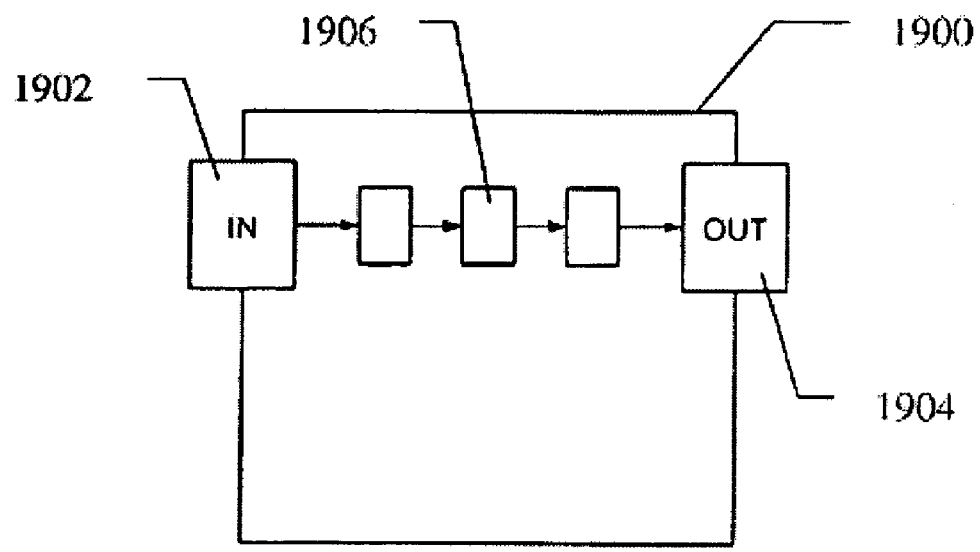
FIG. 19 shows a schematic representation of a module with one input link and one output link.
Figure 20:
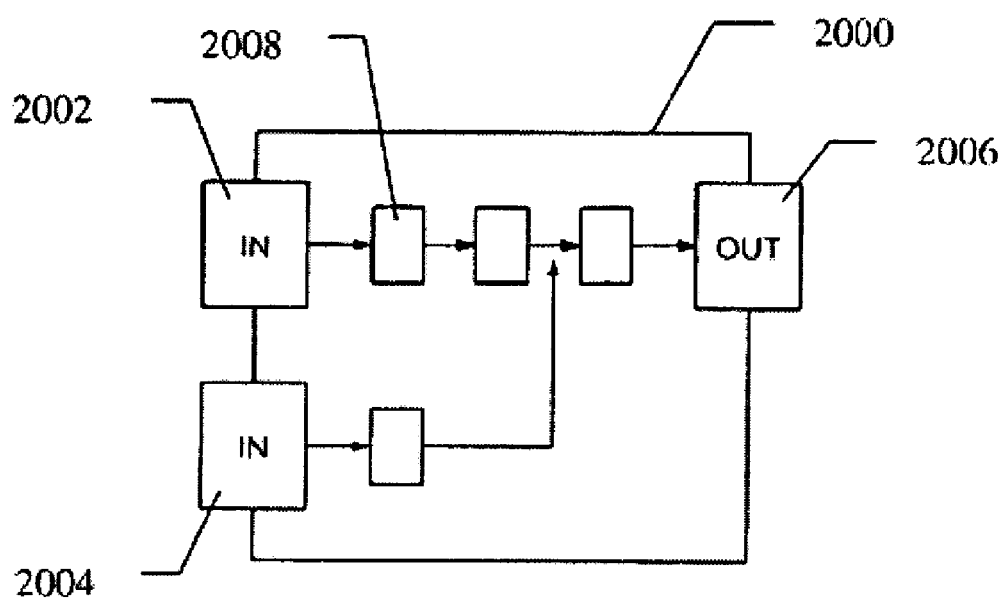
FIG. 20 shows a schematic representation of a module with a plurality of input links and one output link.

FIG. 19 shows a module 1900 with one input link 1902 and one output link 1904. These modules as a rule receive data from a source, process them and forward them to the output, wherein they are forwarded to the output 1904 with a delay 1906 of varying magnitude. However, modules in which the input link and the output link are independent of one another are also possible. They may be for example modules which realize a write and a read DMA channel.

Another configuration is a module 2000 with a plurality of input links 2002, 2004 and only one output link 2006. This configuration is shown schematically in FIG. 20. These modules 2000 as a rule receive data from a plurality of paths, process them and forward them to the output with a possibly required delay 2008. In this case, the data can originate from the same source or be totally independent of one another. By way of example, modules are also possible in which not all of the input links have a connection to the output link, but rather represent independent data sinks.

Figure 21:
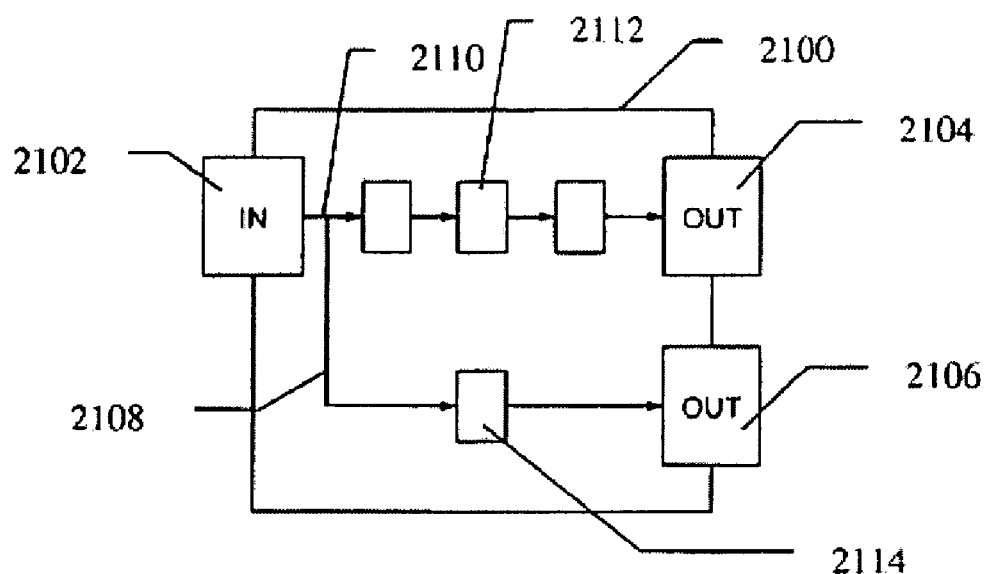
FIG. 21 shows a schematic representation of a module with one input link and a plurality of output links.

FIG. 21 shows as a further possible configuration a module 2100 with one input 2102 and a plurality of output links 2104, 2106. In these modules 2100, as a rule data are received by an input 2102 and processed via different internal data paths 2108, 2110. The results of all the data paths are respectively output via a dedicated output. The delay 2112, 2114 on the data paths 2108, 2110 and thus the output latency can be different for the individual output links 2104, 2106. However, modules are also possible in which individual output links are not fed from input links, but rather represent independent data sources.

Figure 22:
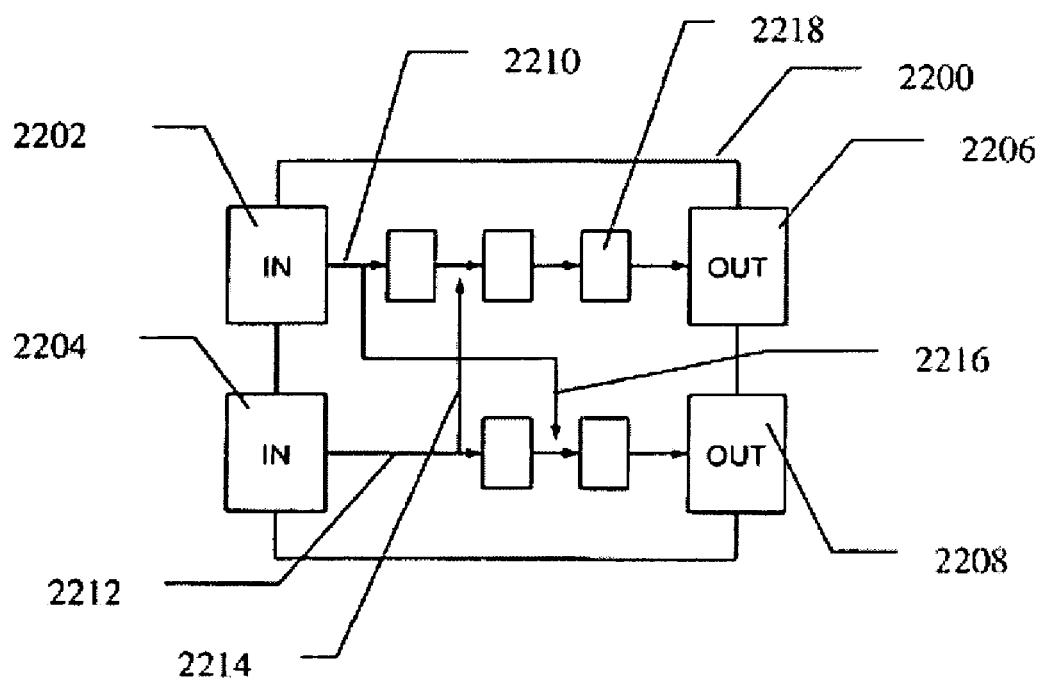
FIG. 22 shows a schematic representation of a module with a plurality of input links and a plurality of output links.

FIG. 22 shows as a last configuration possibility a module 2200 with a plurality of input links 2202, 2204 and a plurality of output links 2206, 2208. Data are received by a plurality of inputs and processed via different internal data paths 2210, 2212. The results of all the data paths are respectively output via a dedicated output. In this case, the internal data paths can operate independently of one another or else exchange data via cross-connections 2214, 2216. The delay 2218 on the data paths and thus the output latency can be different for the individual output links 2206, 2208. Individual independent input and output links are also possible.

Figure 23:
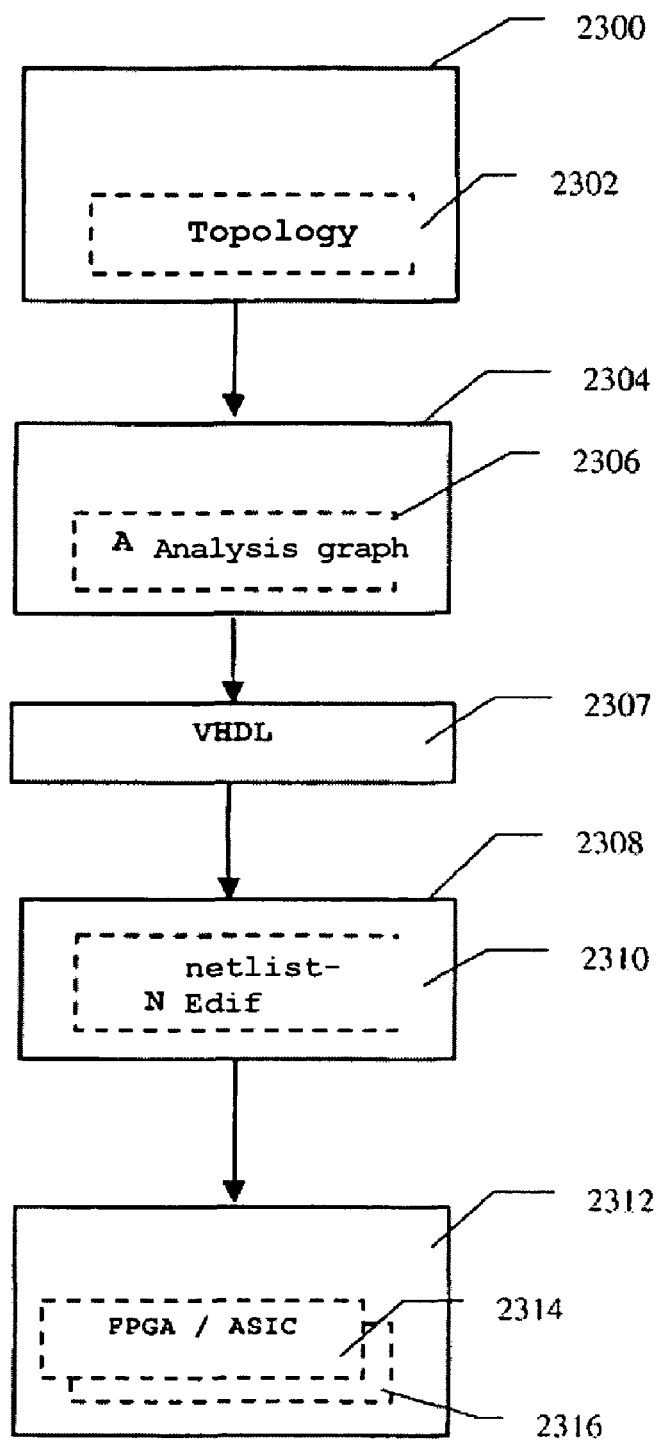
FIG. 23 shows a schematic representation of the layers of implementation of a module.

As is shown in FIG. 23, it is possible to represent the implementation of a module in four layers.

A topology 2302 is created on the description layer 2300. This is done on a graphical basis graphically or texturally. The following items of information, in particular, are relevant on the description layer 2300:

the parameterizable description of the module which is then synthesized later, i.e. translated to the hardware;

a simulation description of the module;

a description of the formal interface (links, parameters, format, range limits, etc.);

a description of the access interface in hardware, that is to say what parameters/registers can the user alter during the execution time in a module, and how.

The implementations of the hardware circuits in a hardware description language, for example VHDL, are generated on the coding layer 2304. It is also possible to generate the hardware description in other hardware description languages. For this purpose, the corresponding compilers are respectively required in order to translate the description of the implementations into an Edif netlist. The analysis graph 2306, which realizes the calculation of possibly required buffers, inter alia, on the basis of the computation rules stored in the program, is also formed within the coding layer.

In the synthesis layer 2308, the Edif netlist 2310 are generated from the highly parameterized hardware description of the coding layer 2304. Once an Edif netlist 2310 has been generated, then in the case of FPGAs the place-route tools of the FPGA manufacturers are used to generate therefrom a configuration which executes the desired algorithm. This is converted in the form of masks for the production process. In the case of ASICs, they are the corresponding place, route and map tools of the corresponding ASIC fabs.

In the layer of hardware implementation 2312, for the FPGA 2314 the finished FPGA program or bit stream generated in the synthesis layer is loaded (also as often as desired depending on FPGA type) and implements the circuit. The ASIC 2316 is fabricated in accordance with the masks calculated in the synthesis and executes the specified algorithm.

Figure 24:
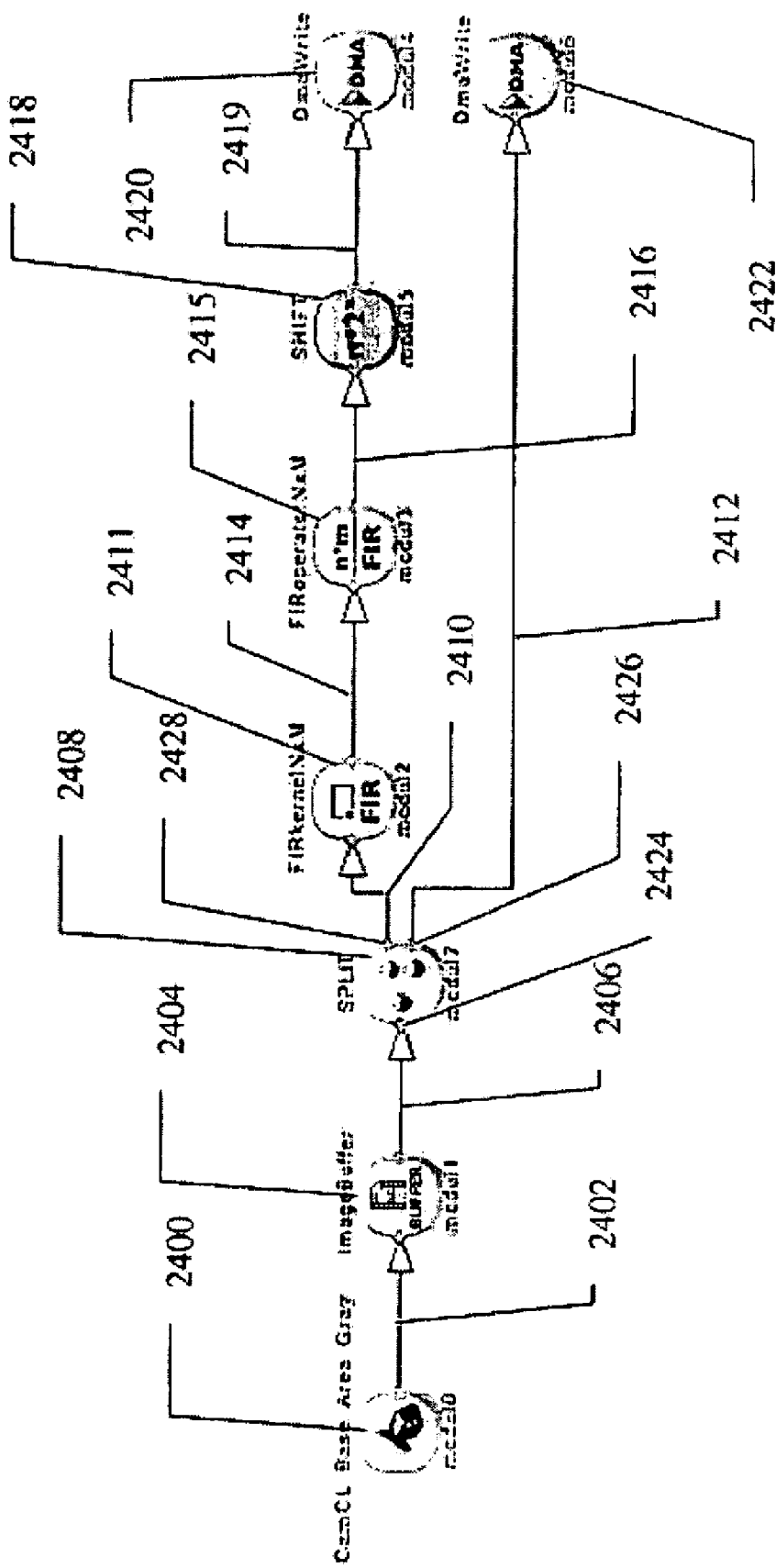
FIG. 24 shows a graphical representation (screen shot) of an exemplary embodiment of a topology.

FIG. 24 shows an exemplary representation of the screen shot for a topology from the user's point of view. A camera data flow from module 2400 is transferred via the data path 2402 to module 2404 and buffered there. Via the data path 2406, the data flow is transferred further to module 2408 and split there. Via the data paths 2410, 2414, 2416, 2419, one data flow is led in order via the modules 2411, 2415 to a shift operator 2418, reduced in size here and fed to the DMA channel 2420 of a PC. The second data flow is originally forwarded via the data path 2412 directly to a second DMA channel 2422. The representations of the modules on the graphic also show the graphical symbols of the input links, e.g. 2424, and of the output links, e.g. 2426, 2428, from which the various data paths run.

Figure 25:
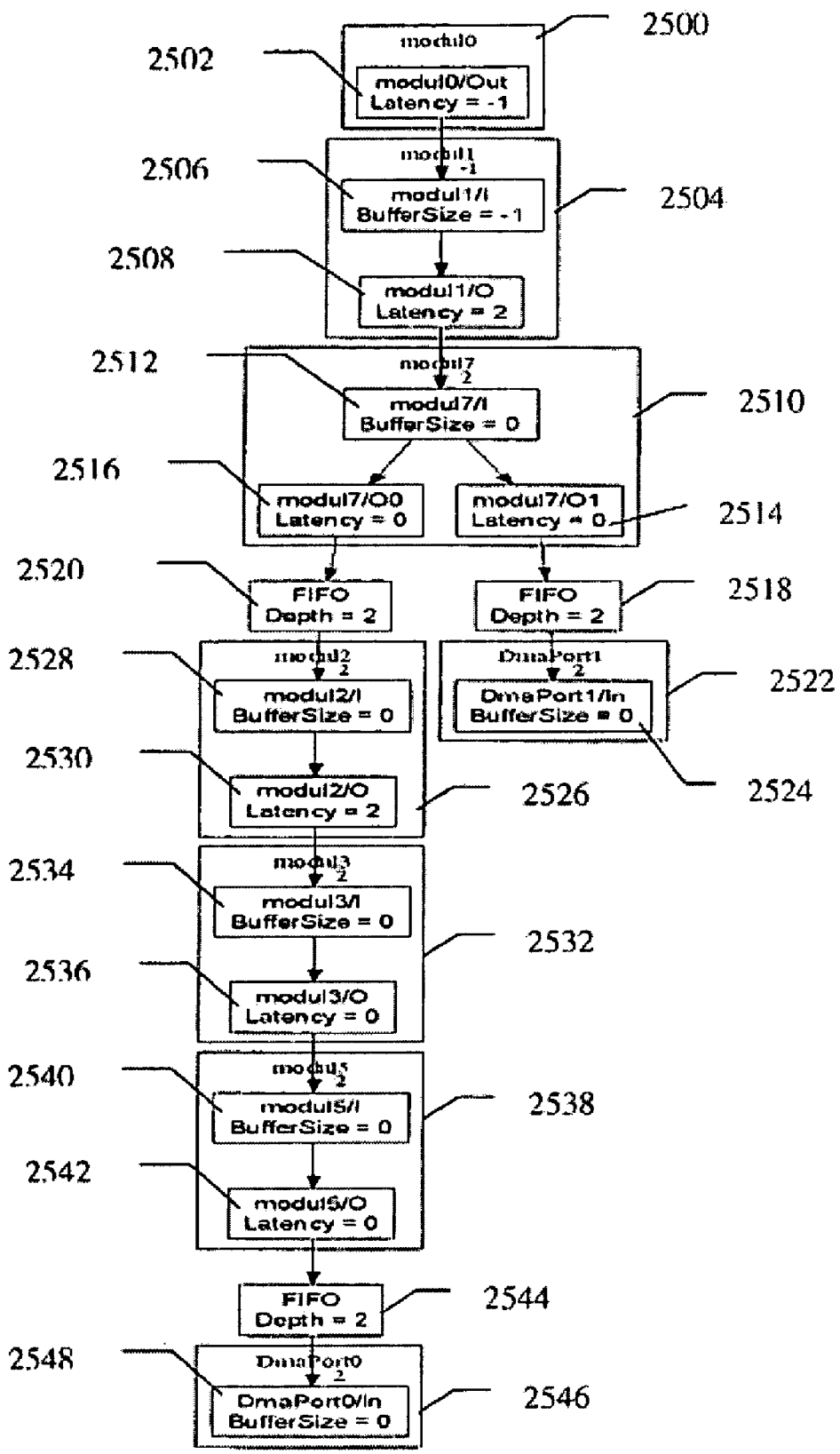
FIG. 25 shows a schematic representation of the analysis graph with respect to the topology from 24.

FIG. 25 shows the analysis graph with respect to the topology represented in FIG. 24.

From an M module 2500 with an output latency 2502 of the value −1, data are transferred to a next M module 2504 with a buffer size 2506 of −1. This means in this case that the data stream is not stopped between the two modules.

From the M module 2504 with an output latency 2508 of the value 2, the data are transferred to a next O module 2510 with a buffer size 2512 of the value 0. In said O module 2510, the data flow is split and transferred via the output links 2514, 2516 to the M modules 2522 and 2526, respectively. On the basis of the computation rules of the rule system, a required additional buffer depth of 2 was calculated in this case. As a result of this, the modules 2518 and 2520 were automatically inserted between the O module 2510 and the M modules 2528 and 2524, respectively. The modules 2518 and 2520 represent FIFO elements having a respective buffer depth of the value 2.

After branching, one data flow runs further from the M module 2526 with an output latency 2530 of the value 2 to the O module 2532 with a buffer size 2534 of 0 and an output latency 2536 of 0. The data flow runs further from the O module 2538 with a buffer size 2540 of 0 and an output latency 2542 of 0 to the M module 2546 with a buffer size 2548 of 0. On the basis of the computation rules of the rule system, a required additional buffer depth of 2 between the modules 2538 and 2546 was determined in this case. As a result of this, the module 2544 with a buffer depth of 2 was automatically inserted between the modules 2538 and 2546. The second data flow takes place from the O module 2510 via the automatically inserted module 2518 directly to the M module 2522 with the buffer size 2524 of 0.

REFERENCE SYMBOLS

100 Input link
102 Output link
104 Data signal (DATA)
106 Control signal (CTRL)
108 Inhibit signal (INH)
110 Clock signal (CLK)
200 O module
202 Input link
204 Data path
205 Data path
206 CTRL logic
208 Function logic
210 Output link
300 O module with a plurality of input links
302 Input link
304 Input link
306 Control signal (CTRL)
310 Data path
312 Data path
400 P module
402 Input link
404 Data path
406 Data path
408 Function logic
410 Data path
412 Output link
500 P module with a plurality of input links
502 Input link
504 Input link
505 Function logic
506 Data path
510 Data path
512 Data path
514 Data path
516 Data path
518 Data path
520 Output link
522 Data path
600 M module
602 Input link
604 Data path
606 Data path
608 Function logic
610 Output link
700 M module with a plurality of input links
702 Input link
704 Input link
706 Data path
708 Function logic
710 Output link
712 Data path
800 Data path
900 Data path
1000 Data path
1100 Data path
1200 O module
1202 Output of a module
1204 Data path
1206 Input of a module
1208 Input of a module
1210 O module
1212 Output of a module
1214 Data path
1216 Input of a module
1218 Input of a module
1220 Input of a module
1222 Data path
1224 Data path
1226 Data path
1228 Output of a module
1300 Output of a module
1302 Output of a module
1304 M module
1306 M module
1308 Input of a module
1310 Input of a module
1312 P module
1314 Data path
1316 Data path
1317 Data path
1400 Input of a module
1402 Input of a module
1404 M module
1406 O or P module
1408 O or P module
1410 Output of a module
1412 Output of a module
1414 Data path
1416 Data path
1500 Module
1502 Input of a module
1504 Output of a module
1506 Output of a module
1508 Module
1510 Module
1512 Output of a module
1514 Output of a module
1516 Input of a module
1518 Input of a module
1520 Module
1522 Module
1524 Module
1526 Output of a module
1528 Output of a module
1530 Input of a module
1532 Input of a module 1534 Module
1600 O module
1602 P module
1603 M module
1604 M module
1605 M module
1606 Signal flow CTRL
1607 O module
1608 Signal flow INH
1610 Signal flow DATA
1612 Signal flow DATA
1614 Signal flow DATA
1616 Signal flow DATA
1618 Signal flow DATA
1620 Signal flow DATA
1622 Signal flow DATA
1624 Signal flow CTRL
1626 Signal flow CTRL
1628 Signal flow DATA
1630 Signal flow DATA
1632 Signal flow DATA
1634 Signal flow DATA
1636 Signal flow DATA
1638 O module
1640 O module
1642 O module
1644 P module
1646 O module
1648 O module
1650 Signal flow DATA
1652 Signal flow DATA
1654 Signal flow CTRL
1656 Signal flow CTRL
1658 Signal flow INH
1700 Module
1702 Input link
1704 Input link
1800 Module
1802 Output link
1804 Output link
1900 Module
1902 Input link
1904 Output link
1906 Delay (latency)
2000 Module
2002 Input link
2004 Input link
2006 Output link
2008 Delay (latency)
2100 Module
2102 Input link
2104 Output link
2106 Output link
2108 Data path
2110 Data path
2112 Delay (latency)
2114 Delay (latency)
2200 module
2202 Input link
2204 Input link
2206 Output link
2208 Output link
2210 Data path
2212 Data path
2214 Data path (cross-connection)
2216 Data path (cross-connection)
2218 Delay (latency)
2300 Description layer
2302 Topology
2304 Coding layer
2306 Analysis graph
2308 Synthesis layer
2310 Edif netlist
2312 Hardware implementation layer
2314 FPGA
2316 ASIC
2400 Module
2402 Data path
2404 Module
2406 Data path
2408 Module
2410 Data path
2411 Module
2412 Data path
2414 Data path
2415 Module
2416 Data path
2418 Shift operator
2419 Data path
2420 DMA channel of a PC
2422 DMA channel
2424 Input link
2426 Output link
2428 Output link
2500 Module
2502 Output latency
2504 Module
2506 Buffer size
2508 Output latency
2510 Module
2512 Buffer size
2514 Output link
2516 Output link
2518 Module
2520 Module
2522 Module
2524 Buffer size
2526 Module
2528 Module
2530 Output latency
2532 Module
2534 Buffer size
2536 Output latency
2538 module
2540 Buffer size
2542 Output latency
2544 Module
2546 Module
2548 Buffer size

The invention claimed is:

1. A method for programming hardware for processing user data on a machine including the hardware, comprising the following steps:
   a) a plurality of modules are made available, wherein each module can execute at least one function for processing the user data;
   b) the modules are classified into a plurality of module types according to predetermined properties;
   c) interfaces for interconnecting the modules are provided;
   d) interconnection rules are defined depending on the module types to accomplish self-regulating control of a data flow between the interconnected modules by means of control and inhibit signals;

d1) wherein the inhibit signals are generated by a module type;
d2) wherein the data flow is stopped by an active inhibit signal running in opposite direction to the direction of the data flow;
d3) wherein the control signals running in the direction of the data flow control the data flow via the indication of the validity of data;
e) an interconnection of the modules (topology) which corresponds to a sequence of functions which is valid for processing the user data is provided; and
f) the hardware programming is generated from the topology thereby enabling the machine to process user data, characterized in that a module has an output latency which determines the number of valid data words the module can output after the data flow to this module has been stopped.

2. The method of claim 1,
characterized
in that graphical symbols are used for representing modules for processing user data; and
in that the topology is created from modules on a graphically oriented basis according to a modular principle.

3. The method of claim 2,
characterized
in that at an interface of a module a data structure (link) exists which comprises user data signals (data) and a clock signal (CLK), and/or control signals (CTRL) and/or an inhibit signal (INH),
wherein input links for receiving data and output links for outputting data are defined, and
wherein the interfaces enable an output of a first module to be connected to an input of a second module;
in that a data structure of the output link type is provided for each output of a module; and
in that a data structure of the input link type is provided for each input of a module.

4. The method of claim 1,
characterized
in that in a module at least one function logic realizes the processing of the user data.

5. The method of claim 1,
characterized
in that a module type with the following properties is defined (O module):
a) the O module can change the values of user data but cannot erase user data;
b) the O module does not influence the control data flow;
c) an inhibit signal has no influence on the O module;
d) the data experience a precisely defined delay (latency) when passing through the O module;
e) in the case of an O module having a plurality of input links, the user data must be present in phase; and
f) in the case of an O module having a plurality of input links, the inhibit signal is passed to all the input links.

6. The method of claim 5,
characterized in that a module type with the following properties is defined (P module):
a) the P module can change the values of user data and erase user data;
b) the P module can change and erase the control data flow;
c) an inhibit signal has no influence on the P module;
d) the data experience a precisely defined delay (maximum latency) when passing through the P module, wherein the delay experienced by individual user data can also be less than said precisely defined delay;
e) in the case of a P module having a plurality of input links, the data must be present in phase,
wherein the function logic is fed with control data from at least one of the input links, and
wherein the inhibit signal is passed to all the input links.

7. The method of claim 6,
characterized
in that a module type with the following properties is defined (M module):
a) the M module can change the values of user data and erase user data and generate new user data;
b) the M module can change, erase and generate the control data flow;
c) the M module can generate an inhibit signal;
d) the user data and control data experience an indeterminate delay when passing through the M module;
e) the M module has on its input side an input buffer having a buffer size for storing user data and control data; and
f) in the case of an M module having a plurality of input links, incoming user data and control data can originate from independent sources (input links).

8. The method of claim 7,
characterized
in that modules of different module types are interconnected according to the following rules:
a) the series connection of an O or P module with an O or P module is possible in unrestricted manner; and/or
b) when the output of an O or P module is interconnected with the input of an M module (series connection), the buffer size of the M module must be greater than or equal to the output latency of the O or P module; and/or
c) the interconnection of the output of an M module with the input of an O or P module (series connection) is possible in unrestricted manner; and/or
d) when the output of a first M module is interconnected with the input of a second M module (series connection), the buffer size of the second M module must be greater than the output latency of the first M module; and/or
e) in the case of parallel connection of a first and at least one second O module whose outputs are interconnected with the inputs of a third O or P module, it is necessary to insert, downstream or upstream of the first or second O module depending on which has the smaller output latency, a delay register having a number of stages equal to the difference in the output latencies of the first and second O modules, in order that synchronization of the data remains ensured at the inputs of the third module; and/or
f) a parallel connection of a first P or M module with at least one second P or M module whose outputs are interconnected with the inputs of a third O or P module is impermissible; and/or
g) a parallel connection of a first O, P or M module with at least one second O, P or M module whose outputs are interconnected with the inputs of a third M module is permissible.

9. The method of claim 8,
characterized
in that a check is made to determine whether the interconnection rules are complied with by the topology; and
in that—if possible—a topology that does not comply with the interconnection rules is supplemented to fulfill the interconnection rules.

10. The method of claim 1,
characterized
in that a nesting of module arrangements is implemented, wherein a module is constructed from an arrangement of a plurality of modules.

11. The method of claim 10,
characterized
in that a plurality of nestings and interconnections of modules (components) are created for implementing in each case a predetermined function (library).

12. The method of claim 1,
characterized
in that a topology is created from modules and/or components from a library on a graphically oriented basis according to the modular principle.

13. A data carrier on which is stored a data structure which executes the method recited in claim 1 after being loaded into a working and/or main memory of a processing unit, of a microcontroller, digital signal processor (DSP), field programmable gate array (FPGA) or computer, or a plurality thereof in a network.

14. A logic circuit obtained by implementing the method recited in claim 1.

15. The method of claim 1,
characterized in that a module type with the following properties is defined (P module):
a) the P module can change the values of user data and erase user data;
b) the P module can change and erase the control data flow;
c) an inhibit signal has no influence on the P module;
d) the data experience a precisely defined delay (maximum latency) when passing through the P module, wherein the delay experienced by individual user data can also be less than said precisely defined delay;
e) in the case of a P module having a plurality of input links, the data must be present in phase,
wherein the function logic is fed with control data from at least one of the input links, and
wherein the inhibit signal is passed onto all the input links.

16. The method of claim 1,
characterized
in that a module type with the following properties is defined (M module):
a) the M module can change the values of user data and erase user data and generate new user data;
b) the M module can change, erase and generate the control data flow;
c) the M module can generate an inhibit signal;
d) the user data and control data experience an indeterminate delay when passing through the M module;
e) the M module has on its input side an input buffer having a buffer size for storing user data and control data; and
f) in the case of an M module having a plurality of input links, incoming user data and control data can originate from independent sources (input links).

17. A logic circuit for processing user data in a machine including the circuit, comprising:
a) a plurality of modules, wherein each module can execute at least one function for processing the user data;
b) wherein the modules can be classified into a plurality of module types according to predetermined properties;
c) predetermined interfaces for interconnecting the modules;
d) wherein interconnections between the modules are implemented, depending on the module types, by means of control and inhibit signals that effect a self-regulating control of data flow between the interconnected modules;
 d1) wherein the inhibit signals are generated by a module type;
 d2) wherein the data flow is stopped by an active inhibit signal running in opposite direction to the direction of data flow;
 d3) wherein the control signals running in the direction of data flow control the data flow via the indication of the validity of data; and
e) wherein the logic circuit is implemented by an interconnection of the modules which corresponds to a sequence of functions which is valid for processing the user data,
characterized in that a module has an output latency which determines the number of valid data words the module can output after the data flow to this module has been stopped.

18. A graphical editor for programming hardware for processing user data in a machine including the editor, comprising:
a) graphic symbols for representing modules, wherein each module can execute a function for processing the user data if the module is realized in hardware;
b) graphical symbols for representing different module types, wherein the modules can be classified according to predetermined properties in accordance with the module types;
c) at least one graphical symbol for representing interfaces for interconnecting the modules;
d) means for checking whether a permissible interconnection of modules is present in accordance with predetermined interconnection rules, wherein the interconnection rules are defined, depending on the module types, to effect a self-regulating control of data flow between the interconnected modules by means of control and inhibit signals;
 d1) wherein the inhibit signals are generated by a module type;
 d2) wherein the data flow is stopped by an active inhibit signal running in opposite direction to the direction of the data flow;
 d3) wherein the control signals running in the direction of the data flow control the data flow via the indication of the validity of data;
e) graphical means for establishing a graphical representation of an interconnection of modules (topology) which corresponds to a sequence of functions which are valid for processing the user data; and
f) means for translating the graphical representation of the topology into a programming of the hardware thereby enabling the machine to process user data,
characterized in that a module has an output latency which determines the number of valid data words the module can output after the data flow to this module has been stopped.

* * * * *